United States Patent
Takabayashi et al.

(10) Patent No.: US 10,983,272 B2
(45) Date of Patent: Apr. 20, 2021

(54) MULTI-MODE INTERFERENCE MULTIPLEXER/DEMULTIPLEXER AND OPTICAL ELEMENT USING THE SAME

(71) Applicant: Mitsubishi Electric Corporation, Chiyoda-ku (JP)

(72) Inventors: Masakazu Takabayashi, Tokyo (JP); Satoshi Nishikawa, Tokyo (JP); Koichi Akiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/499,754

(22) PCT Filed: Dec. 4, 2017

(86) PCT No.: PCT/JP2017/043383
§ 371 (c)(1),
(2) Date: Sep. 30, 2019

(87) PCT Pub. No.: WO2018/216249
PCT Pub. Date: Nov. 29, 2018

(65) Prior Publication Data
US 2020/0264369 A1   Aug. 20, 2020

(30) Foreign Application Priority Data
May 26, 2017   (JP) .............................. JP2017-104359

(51) Int. Cl.
*G02B 6/12* (2006.01)
*G02B 6/122* (2006.01)
*G02B 6/28* (2006.01)

(52) U.S. Cl.
CPC ....... *G02B 6/12007* (2013.01); *G02B 6/1228* (2013.01); *G02B 6/2813* (2013.01);
(Continued)

(58) Field of Classification Search
None
See application file for complete search history.

(56) References Cited

U.S. PATENT DOCUMENTS

2012/0057817 A1  3/2012  Wesstrom et al.
2012/0251041 A1  10/2012  Ishikawa et al.
(Continued)

FOREIGN PATENT DOCUMENTS

CN   102422190 A   4/2012
JP   2006-323135 A   11/2006
(Continued)

OTHER PUBLICATIONS

International Search Report dated Feb. 6, 2018 in PCT/JP2017/043383 filed on Dec. 4, 2017.
(Continued)

*Primary Examiner* — Jerry Rahll
(74) *Attorney, Agent, or Firm* — Xsensus LLP

(57) ABSTRACT

A multi-mode interference multiplexer/demultiplexer can suppress reflected return light while guiding light to a single-mode waveguide. The multi-mode interference multiplexer/demultiplexer includes a multi-mode waveguide, a first single-mode waveguide connected to a first end, a second single-mode waveguide opposing the first single-mode waveguide, a third single-mode waveguide connected to a second end, a reflecting surface opposing the third single-mode waveguide, and a fourth single-mode waveguide connected to a side end. Light entering from the second or third single-mode waveguide is reflected off the reflecting surface and forms an image at a first connection on a side end of the fourth single-mode waveguide.

12 Claims, 10 Drawing Sheets

(52) U.S. Cl.
CPC .............. *G02B 2006/12104* (2013.01); *G02B 2006/12164* (2013.01)

(56)     References Cited

U.S. PATENT DOCUMENTS

| | | |
|---|---|---|
| 2015/0205043 A1 | 7/2015 | Ishikawa et al. |
| 2016/0011370 A1 | 1/2016 | Okayama |
| 2017/0146742 A1 | 5/2017 | Ishikawa et al. |

FOREIGN PATENT DOCUMENTS

| | | |
|---|---|---|
| JP | 2012-527010 A | 11/2012 |
| JP | 2013-130638 A | 7/2013 |
| WO | WO 2010/132013 A1 | 11/2010 |
| WO | WO 2011/065014 A1 | 6/2011 |

OTHER PUBLICATIONS

Notice of Reasons for Refusal dated May 18, 2018 in Japanese Patent Application No. 2018-516082 (with English language translation), citing documents AA, AO, AP, AR and AS therein.
Office Action dated May 12, 2020 in Chinese Patent Application No. 201780090461.4, 15 pages.

F I G. 1
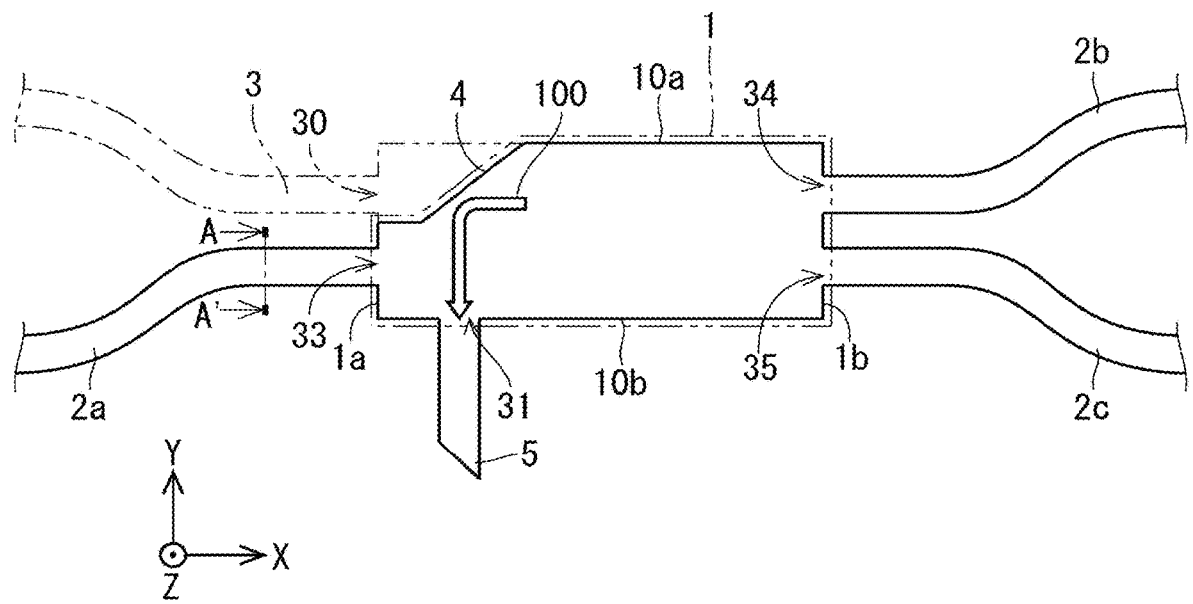
F I G. 2
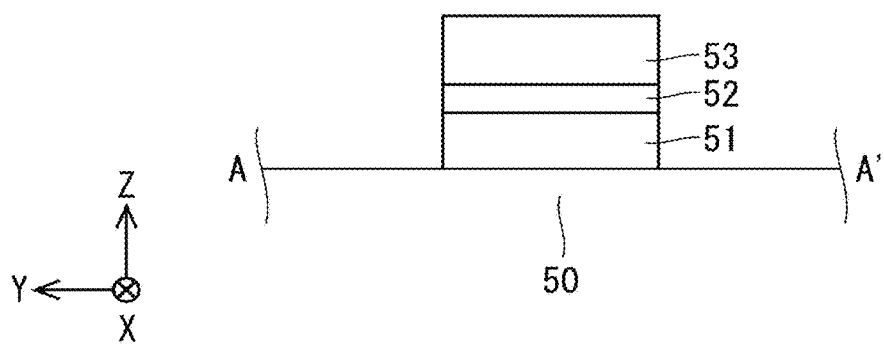

F I G. 1 9
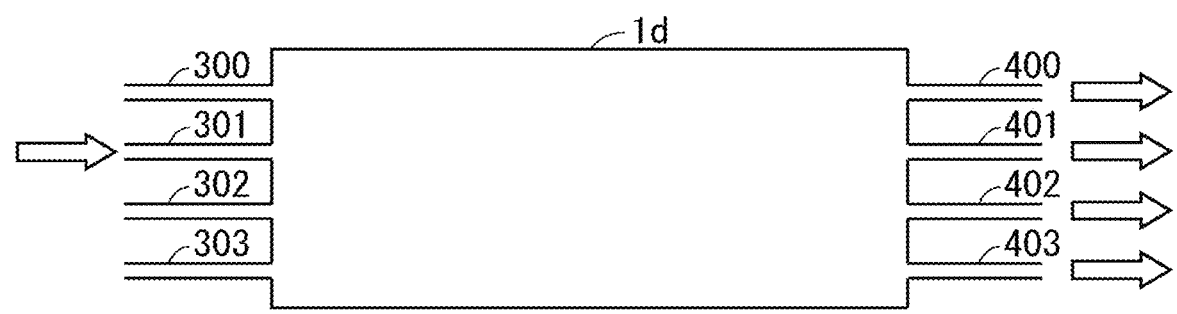

MULTI-MODE INTERFERENCE MULTIPLEXER/DEMULTIPLEXER AND OPTICAL ELEMENT USING THE SAME

TECHNICAL FIELD

A technique disclosed in the specification of the present application relates to suppressing reflected return light in a multi-mode interference multiplexer/demultiplexer.

BACKGROUND ART

Multi-mode interference multiplexer/demultiplexers have conventionally been applied as multiplexer/demultiplexers in optical integrated circuits, and reducing the reflected return light in the multi-mode interference multiplexer/demultiplexers is useful in improving element characteristics such as the extinction ratio of a Mach-Zehnder (MZ) modulator.

For example, Patent Document 1 discloses a configuration in which a multi-mode interference multiplexer/demultiplexer includes an inclined plane so that potential reflected return light is guided to a multi-mode waveguide.

PRIOR ART DOCUMENT

Patent Document

Patent Document 1: Japanese Unexamined Patent Application Publication No. 2012-527010

SUMMARY

Problem to be Solved by the Invention

In Patent Document 1 described above, the inclined plane is located at a position where the potential reflected return light forms an image. Thus, with this structure, reflected light that expands from the image-forming position cannot be guided to a single-mode waveguide and is guided to a multi-mode waveguide.

However, it is difficult with the multi-mode waveguide to handle incident light, and for example, light is easily radiated when a curved waveguide is formed. Meanwhile, if it is possible to guide potential reflected return light to a single-mode waveguide, the light can be dealt with in a curved waveguide, and this facilitates laying out an integrated circuit.

The technique disclosed in the specification of the present application has been made to solve problems as described above, and it is an object of the present application to provide a technique for suppressing reflected return light in a multi-mode interference multiplexer/demultiplexer while guiding potential reflected return light to a single-mode waveguide.

Means to Solve the Problem

According to a first aspect of the technique disclosed in the specification of the present application, a multi-mode interference multiplexer/demultiplexer includes a multi-mode waveguide having a first end, a second end, a first side end, and a second side end, the second end being an end on an opposite side to the first end, and the first side end and the second side end opposing each other, a first single-mode waveguide connected to the first end of the multi-mode waveguide, a second single-mode waveguide connected to the second end of the multi-mode waveguide at a position opposing the first single-mode waveguide, a third single-mode waveguide connected to the second end of the multi-mode waveguide at a position closer to the first side end than the position at which the second single-mode waveguide is connected, a reflecting surface arranged at a position opposing the third single-mode waveguide in the multi-mode waveguide, and a fourth single-mode waveguide connected to the first side end or the second side end. A direction connecting the first end and the second end is a first direction. A direction intersecting with the first direction is a second direction. The first side end and the second side end oppose each other in the second direction. Light entering from the second single-mode waveguide or the third single-mode waveguide is reflected off the reflecting surface and forms an image at a first connection of the fourth single-mode waveguide. The first connection is a connection at the first side end or a connection at the second side end.

According to a second aspect of the technique disclosed in the specification of the present application, an optical element includes at least one multi-mode interference multiplexer/demultiplexer described above.

Effects of the Invention

According to the first aspect of the technique disclosed in the specification of the present application, the multi-mode interference multiplexer/demultiplexer includes a multi-mode waveguide having a first end, a second end, a first side end, and a second side end, the second end being an end on an opposite side to the first end, and the first side end and the second side end opposing each other, a first single-mode waveguide connected to the first end of the multi-mode waveguide, a second single-mode waveguide connected to the second end of the multi-mode waveguide at a position opposing the first single-mode waveguide, a third single-mode waveguide connected to the second end of the multi-mode waveguide at a position closer to the first side end than the position at which the second single-mode waveguide is connected, a reflecting surface arranged at a position opposing the third single-mode waveguide in the multi-mode waveguide, and a fourth single-mode waveguide connected to the first side end or the second side end. A direction connecting the first end and the second end is a first direction. A direction intersecting with the first direction is a second direction. The first side end and the second side end oppose each other in the second direction. Light entering from the second single-mode waveguide or the third single-mode waveguide is reflected off the reflecting surface and forms an image at a first connection of the fourth single-mode waveguide. The first connection is a connection at the first side end or a connection at the second side end. With this configuration, potential reflected return light can be guided to the fourth single-mode waveguide by causing the light to be reflected off the reflecting surface and form an image at the first connection. Accordingly, it is possible to suppress reflected return light in the multi-mode interference multiplexer/demultiplexer while easily forming a layout that includes a curved waveguide for dealing with undesired light.

In particular, according to the second aspect, the optical element includes at least one multi-mode interference multiplexer/demultiplexer described above. With this configuration, it is possible to suppress reflected return light in an optical element such as a Mach-Zehnder modulator or a dual-wavelength integrated modulator.

The object, features, and advantages relating to the technique disclosed in the specification of the present application will become more apparent from the following detailed description and the accompanying drawings.

BRIEF DESCRIPTION OF DRAWINGS

FIG. 1 is a plan view schematically illustrating a configuration of a multi-mode interference multiplexer/demultiplexer according to an embodiment.

FIG. 2 is a sectional view taken along a section A-A' of a single-mode waveguide in FIG. 1.

FIG. 19 is a plan view schematically illustrating a configuration of an ordinary 4×4 multi-mode interference multiplexer/demultiplexer.

DESCRIPTION OF EMBODIMENTS

Figure 3:
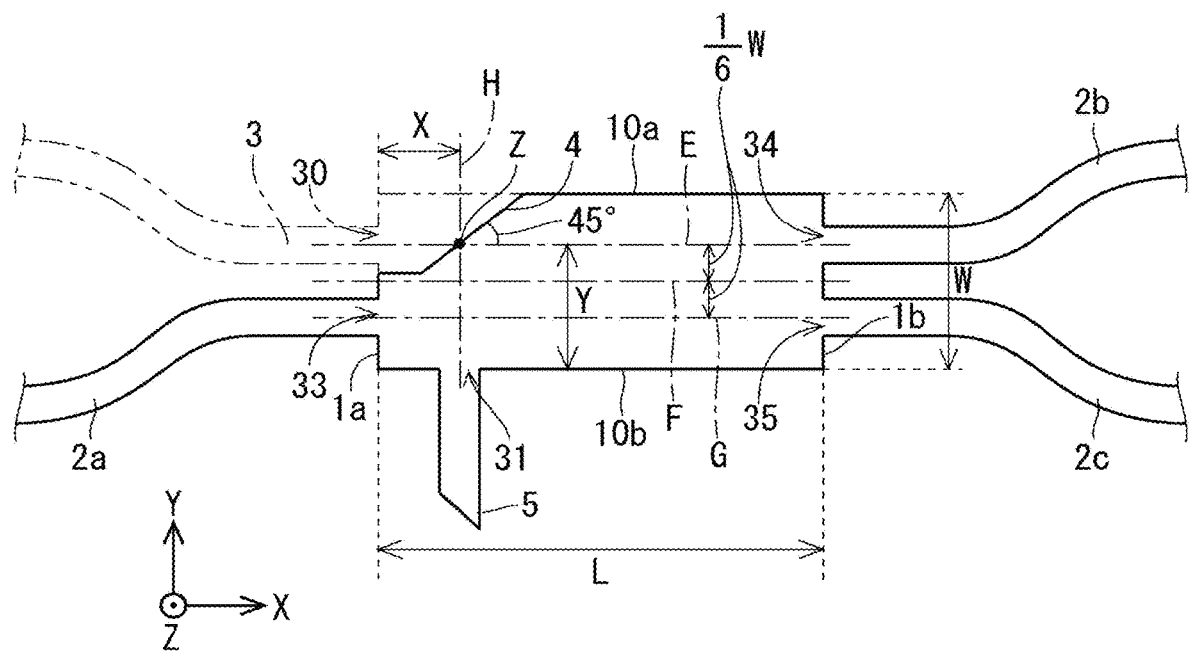
FIG. 3 is a plan view illustrating a detailed configuration of the multi-mode interference multiplexer/demultiplexer illustrated in FIG. 1.

Hereinafter, embodiment will be described with reference to the accompanying drawings.

Note that the drawings are drawn in schematic form, and configurations may be appropriately omitted or simplified for convenience in description. Mutual relationships in size and position among configurations and the like illustrated in different drawings are not always accurate and can be appropriately changed.

In the following description, similar constituent elements are given and illustrated with the same reference signs, and they are assumed to have the same names and the same functions. Therefore, detailed description of such constituent elements may be omitted in some cases to avoid redundant description.

In the following description, terms that mean specific positions and directions, such as "upper," "lower," "left," "right," "side," "bottom," "front," and "back," are used in some cases, but these terms are merely used for the sake of convenience to facilitate understanding of the content of embodiments and may not relate to directions at the time of actual implementation.

In the following description, ordinal numbers such as "first" and "second" are used in some cases, but these terms are merely used for the sake of convenience to facilitate understanding of the content of embodiments and are not intended to limit a sequence or the like indexed by the ordinal numbers.

First Embodiment

A multi-mode interference multiplexer/demultiplexer according to the present embodiment will be described hereinafter.

Configuration of Multi-Mode Interference Multiplexer/Demultiplexer

FIG. 1 is a plan view schematically illustrating a configuration of a multi-mode interference multiplexer/demultiplexer according to the present embodiment. As illustrated in FIG. 1, the multi-mode interference multiplexer/demultiplexer according to the present embodiment includes a multi-mode waveguide 1, a single-mode waveguide 2a, a single-mode waveguide 2b, a single-mode waveguide 2c, and an undesired-light single-mode waveguide 5. A reflecting surface 4 is arranged at a position opposing the single-mode waveguide 2b in the multi-mode waveguide 1.

The multi-mode interference multiplexer/demultiplexer according to the present embodiment branches light entering from the single-mode waveguide 2a into streams of light and emits the streams of light to the single-mode waveguides 2b and 2c. The multi-mode interference multiplexer/demultiplexer according to the present embodiment also combines light entering from the single-mode waveguide 2b and light entering from the single-mode waveguide 2c and emits the combined light to the single-mode waveguide 2a.

The single-mode waveguides 2a, 2b, and 2c from or to which light is incident or emitted are each connected at its connection to the multi-mode waveguide 1. The connection is a boundary portion that connects the single-mode waveguide and the multi-mode waveguide and provides communication between the two waveguides to allow light to enter or exit. The single-mode waveguide 2a is connected to one end 1a of the multi-mode waveguide 1 in the longitudinal direction, and the single-mode waveguides 2b and 2c are connected to the other end of the multi-mode waveguide 1 in the longitudinal direction, i.e., an end 1b on the opposite side to the end 1a to which the single-mode waveguide 2a is connected. The single-mode waveguide 2c is connected at a position opposing the single-mode waveguide 2a. On the end 1b of the multi-mode waveguide 1, the single-mode waveguide 2b is connected at a position closer to a side end 10a than the position where the single-mode waveguide 2c is connected. The reflecting surface 4 is arranged at the positive X-axial direction side than the end 1a.

The undesired-light single-mode waveguide 5 is connected to a side end 10b of the multi-mode waveguide 1. The undesired-light single-mode waveguide 5 is configured to guide and remove light reflected off the reflecting surface 4, i.e., undesired light that is potential reflected return light in the multi-mode interference multiplexer/demultiplexer.

The basic design of the multi-mode interference multiplexer/demultiplexer according to the present embodiment is that of a 2×2 multi-mode interference multiplexer/demultiplexer, but in the multi-mode interference multiplexer/demultiplexer, a single-mode waveguide 3 that is connected at a connection 30 but that is not used is removed, and the reflecting surface 4 and the undesired-light single-mode waveguide 5 that is connected at a connection 31 are arranged instead of the single-mode waveguide 3.

In the case of configuring an MZ interferometer by connecting two ordinary 2×2 multi-mode interference multiplexer/demultiplexers, one single-mode waveguide that is not used is arranged on each of the incidence and exit sides. Thus, such single-mode waveguides can be connected to the side ends 10b of the multi-mode waveguides 1 and used as the undesired-light single-mode waveguides 5 for removing undesired light 100.

When light enters from the single-mode waveguide 2a, the multi-mode waveguide 1 ultimately branches the incident light into two streams of light and emits the two streams of light respectively from the single-mode waveguides 2b and 2c.

When light enters from the single-mode waveguide 2b or 2c, the multi-mode waveguide 1 ultimately branches the incident light into two streams of light. One stream of light is emitted from the single-mode waveguide 2a, and the other stream of light is reflected off the reflecting surface 4 and coupled to the undesired-light single-mode waveguide 5.

FIG. 2 is a sectional view taken along a section A-A' of the single-mode waveguide 2a in FIG. 1. As illustrated in FIG. 2, the single-mode waveguide 2a includes a substrate 50, a lower clad layer 51 formed on the upper face of the substrate 50, a waveguide layer 52 formed on the upper face of the lower clad layer 51, and an upper clad layer 53 formed on the upper face of the waveguide layer 52. The structure of the multi-mode waveguide 1 is similar to that obtained by increasing the Y-axial width of the structure of the single-mode waveguide 2a illustrated in FIG. 2.

The substrate 50 is, for example, an InP substrate. At this time, the lower clad layer 51 and the upper clad layer 53 are InP layers. As the waveguide layer 52, for example, a bulk layer, a multiple quantum well layer (MQW layer) or the like made of an InGaAsP material can be selected and deposited.

The waveguide layer 52 can be formed in an arbitrary shape by photolithography, and in the present embodiment, a semiconductor waveguide pattern as illustrated in FIG. 1 is formed.

FIG. 3 is a plan view illustrating a detailed configuration of the multi-mode interference multiplexer/demultiplexer illustrated in FIG. 1. The basic design of the multi-mode interference multiplexer/demultiplexer according to the present embodiment is that of a 2×2 multi-mode interference multiplexer/demultiplexer, and a multi-mode waveguide length relative to the width of the multi-mode waveguide 1, and the interval between two adjacent single-mode waveguides are based on the basic design of the 2×2 multi-mode interference multiplexer/demultiplexer.

A multi-mode waveguide length L relative to a multi-mode waveguide width W is expressed by the following equation.

$$L = 2 \times n_{eff} \times W^2/(3 \times \lambda)$$  Equation 1

Here, $n_{eff}$ represents the equivalent refractive index, and $\lambda$ represents the wavelength. Each single-mode waveguide connected to the multi-mode waveguide 1 is arranged at a position spaced by a distance of $\pm W/6$ from a center line F of the multi-mode waveguide 1 that extends along the longitudinal direction. Here, an axis line of the single-mode waveguide 2b that extends along the longitudinal direction is referred to as an axis line E, and an axis line of the single-mode waveguide 2c that extends along the longitudinal direction is referred to as an axis line G.

That is, in the multi-mode waveguide 1, the multi-mode waveguide width W and the multi-mode waveguide length L are set so that the light entering from the single-mode waveguide 2a forms an image at either a connection 34 of the single-mode waveguide 2b or a connection 35 of the single-mode waveguide 2c, and conversely, the light entering from the single-mode waveguide 2b or 2c forms an image at a connection 33 of the single-mode waveguide 2a.

As specific examples of the multi-mode waveguide width W and the multi-mode waveguide length L, for example, cases are assumed in which the multi-mode waveguide length L is 204 μm when the multi-mode waveguide width W is 12 μm and in which the multi-mode waveguide length L is 460 μm when the multi-mode waveguide width W is 18 μm (where $n_{eff}$ is 3.3 and $\lambda$ is 1.55 μm, in both cases).

In FIG. 3, the axis line E corresponds to a center line that connects the single-mode waveguide 3, which should originally have been provided in a 2×2 multi-mode interference multiplexer/demultiplexer but that is removed because it is not used, and the single-mode waveguide 2b connected so as to oppose the single-mode waveguide 3. An intersection point of the axis line E and the reflecting surface 4 is referred to as an intersection point Z. Note that the intersection point Z is a typical reflecting point at which the light entering from the single-mode waveguide 2c or 2b is reflected off the reflecting surface 4.

Then, a distance between the intersection point Z and the connection 31 connected to the undesired-light single-mode waveguide 5 is referred to as a distance Y. In FIG. 3, the distance Y is a distance that is along the Y-axial direction and along an axis line H of the undesired-light single-mode waveguide 5, which is arranged so that the axis line H along the longitudinal direction passes through the intersection point Z.

A distance between the intersection point Z and the connection 30 at which the single-mode waveguide 3 is connected to the multi-mode waveguide 1 is referred to as a distance X. In FIG. 3, the distance X is along the X-axial direction.

In the multi-mode interference multiplexer/demultiplexer according to the present embodiment, the reflecting surface 4 is arranged so as to make the distances X and Y equal. Therefore, light that should have formed an image at the connection 30 of the single-mode waveguide 3 is reflected off the reflecting surface 4 and then forms an image at the connection 31 on the side end 10b of the multi-mode waveguide 1. In FIG. 3, an angle of the reflecting surface 4 with respect to the X-axial direction is 45°.

Accordingly, the light reflected off the reflecting surface 4 forms an image at the connection 31 of the undesired-light single-mode waveguide 5, which is arranged so that the axis line H along the longitudinal direction passes through the intersection point Z. This light is then guided to and removed within the undesired-light single-mode waveguide 5.

Here, the light entering from the single-mode waveguides 2b and 2c travels in various directions due to reflection or interference within the multi-mode waveguide 1, but at the position where the reflecting surface 4 is arranged, the light is gathering so as to form an image at the single-mode waveguide 3. Thus, positions on the reflecting surface 4, at which the light entering from the single-mode waveguides 2b and 2c is reflected, are located at or around the intersection point Z.

As described above, the light entering from the single-mode waveguides 2b and 2c is gathering on the reflecting surface 4, so that the directions of travel of the light on the reflecting surface 4 are oriented in approximately the same negative X axial direction. Thus, in the case where the angle of the reflecting surface 4 with respect to the X-axial direction is 45°, the directions of travel of the light reflected off the reflecting surface 4 are also oriented in approximately the same negative Y axial direction.

Operations of Multi-Mode Interference Multiplexer/Demultiplexer

Light entering from a single-mode waveguide into the multi-mode waveguide 1 propagates while being reflected off or interfering with a side end of the multi-mode waveguide 1, and ultimately forms an image at two locations.

Figure 4:
FIG. 4 illustrates the result of simulating how light entering from a single-mode waveguide propagates through a multi-mode waveguide in the case of an ordinary 2×2 multi-mode interference multiplexer/demultiplexer.

FIG. 4 illustrates the result of simulating how the light entering from the single-mode waveguide 2b propagates through the multi-mode waveguide 1 in the case of an ordinary 2×2 multi-mode interference multiplexer/demultiplexer.

As illustrated in FIG. 4, in the case of a 2×2 multi-mode interference multiplexer/demultiplexer, i.e., in the case where the single-mode waveguide 2a and the single-mode waveguide 3 are connected to the end 1a of the multi-mode waveguide 1, the light entering from the single-mode waveguide 2b forms an image at each of the single-mode waveguide 2a and the single-mode waveguide 3. In the case of simulating how the light entering from the single-mode waveguide 2c propagates through the multi-mode waveguide 1, the propagation is line symmetrical to that in the form illustrated in FIG. 4, and the light entering from the single-mode waveguide 2c forms an image at each of the single-mode waveguide 2a and the single-mode waveguide 3.

Since light forms an image at two locations, the light is gathering toward those two points. However, the light-gathering angle remains unchanged even if the orientation of the light propagation is changed by causing the light to be reflected off the reflecting surface 4 in a path on the way to the light-gathering locations. Therefore, the reflected light forms an image at a distance of propagation similar to that in the case where there is no reflecting surface 4.

Accordingly, if the reflecting surface 4 and the undesired-light single-mode waveguide 5 are arranged so as to make the distances X and Y equal as described above, the light entering from the single-mode waveguide 2b can form an image at the undesired-light single-mode waveguide 5, which is connected to the side end 10b of the multi-mode waveguide 1.

Then, the light forming an image at that location can easily be removed as undesired light because it is guided in the single-mode waveguide.

Figure 5:
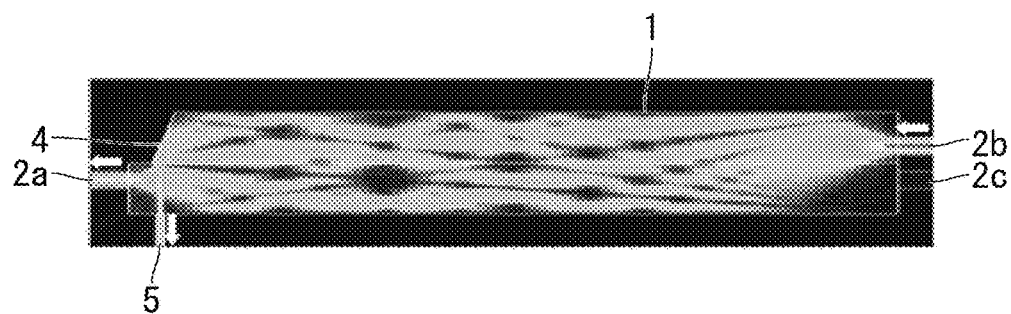
FIG. 5 illustrates the result of simulating how light entering from a single-mode waveguide propagates through a multi-mode waveguide in the case of the multi-mode interference multiplexer/demultiplexer according to the embodiment.

FIG. 5 illustrates the result of simulating how the light entering from the single-mode waveguide 2b propagates through the multi-mode waveguide 1 in the case of using the multi-mode interference multiplexer/demultiplexer according to the present embodiment.

As illustrated in FIG. 5, in the case of using the multi-mode interference multiplexer/demultiplexer according to the present embodiment, one beam of light, i.e., light that should have formed an image at the single-mode waveguide 3 in FIG. 4, is reflected off the reflecting surface 4 and forms an image at the undesired-light single-mode waveguide 5 as undesired light.

Variations of Multi-Mode Interference Multiplexer/Demultiplexer

In the configuration illustrated in FIG. 1, the undesired-light single-mode waveguide 5 is connected to the side end 10b that is located at a position remote from the connection 30 connected to the single-mode waveguide 3, out of the two side ends of the multi-mode waveguide 1.

The reflecting surface 4 is formed and inclined so as to approach the end 1b of the multi-mode waveguide 1 as going away from the center line F of the multi-mode waveguide 1.

Figure 6:
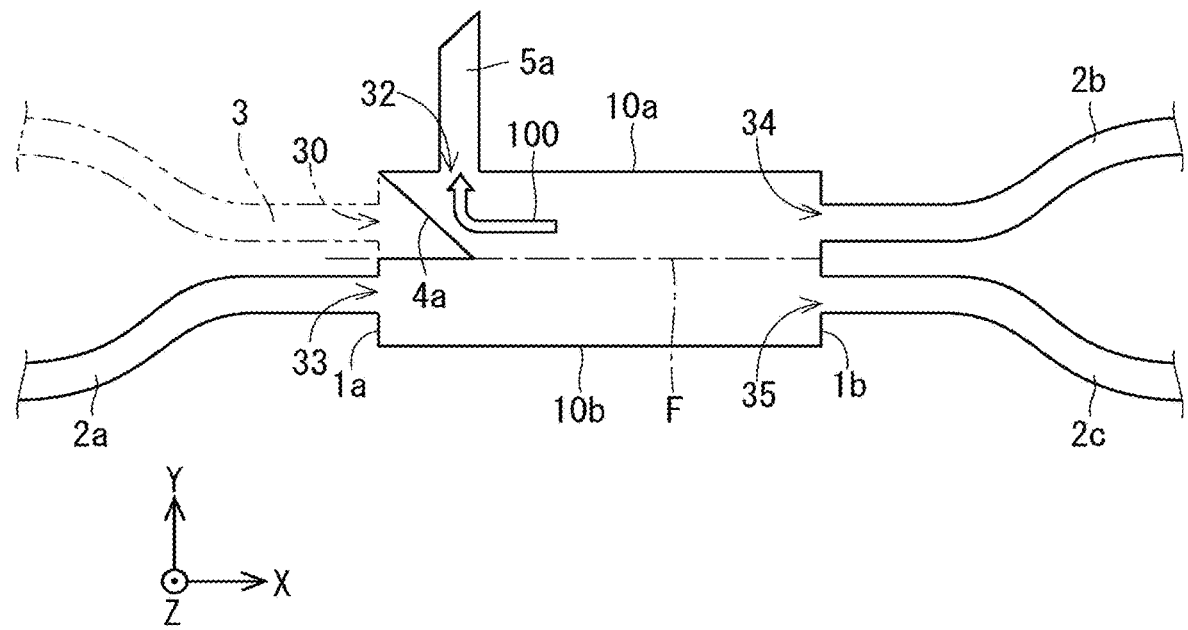
FIG. 6 is a plan view schematically illustrating a configuration of a variation of the multi-mode interference multiplexer/demultiplexer according to the embodiment.

On the other hand, a configuration as illustrated in FIG. 6 is also possible in which an undesired-light single-mode waveguide 5a is connected at a connection 32 on the side end 10a that is located at a position closer to the connection 30 that has been connected to the single-mode waveguide 3, out of the two side ends of the multi-mode waveguide 1.

In that case, a reflecting surface 4a is formed and inclined so as to go away from the end 1b of the multi-mode waveguide 1 as going away from the center line F of the multi-mode waveguide 1. Here, FIG. 6 is a plan view schematically illustrating a configuration of a variation of the multi-mode interference multiplexer/demultiplexer according to the present embodiment.

Note that the tip end of the undesired-light single-mode waveguide 5a or the tip end of the undesired-light single-mode waveguide 5 (see FIG. 1) may have an inclined shape. In the case where the tip end of the undesired-light single-mode waveguide has an inclined shape, undesired light may be radiated to the outside of the waveguide. Alternatively, undesired light may be radiated to the outside of the substrate 50 by arranging the undesired-light single-mode waveguide 5a or the undesired-light single-mode waveguide 5 (see FIG. 1) such that the tip end of the undesired-light single-mode waveguide reaches the end of the substrate 50.

The multi-mode interference multiplexer/demultiplexer according to the present embodiment can guide undesired light, i.e., potential reflected return light, to the undesired-light single-mode waveguide. Accordingly, the light can be dealt with in a curved waveguide, and this facilitates laying out an integrated circuit or the like.

If undesired light is guided to the multi-mode waveguide 1, an occupied area will increase because the multi-mode waveguide has a large waveguide width. Moreover, if the multi-mode waveguide 1 have a curved shape, the light may be radiated to the outside of the multi-mode waveguide 1 and turn into stray light that can affect other elements. Therefore, if undesired light is guided to the multi-mode waveguide 1, problems will occur, particularly in an integrated circuit.

With the multi-mode interference multiplexer/demultiplexer according to the present embodiment, undesired light, i.e., potential reflected return light generated in a multi-mode interference multiplexer/demultiplexer, can be guided to and removed within a single-mode waveguide.

Second Embodiment

A multi-mode interference multiplexer/demultiplexer according to the present embodiment will be described. In the following description, configurations similar to those described in the above embodiment are given the same reference signs, and detailed description thereof will be appropriately omitted.

Configuration of Multi-Mode Interference Multiplexer/Demultiplexer

Figure 7:
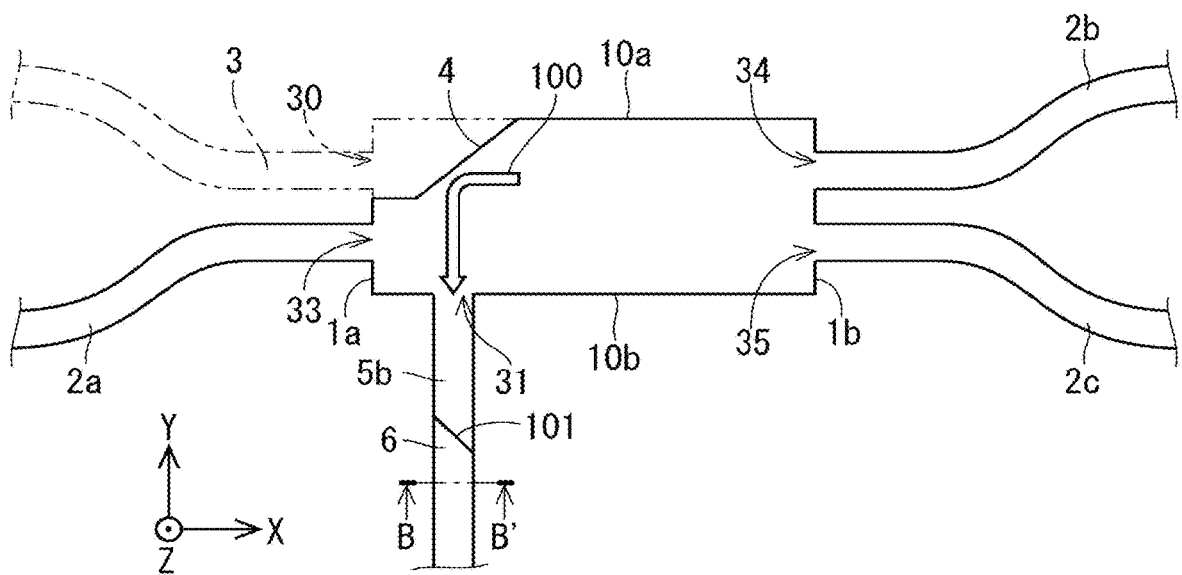
FIG. 7 is a plan view schematically illustrating a configuration of a multi-mode interference multiplexer/demultiplexer according to an embodiment.

FIG. 7 is a plan view schematically illustrating a configuration of the multi-mode interference multiplexer/demultiplexer according to the present embodiment. The multi-mode interference multiplexer/demultiplexer according to the present embodiment includes a multi-mode waveguide 1, a single-mode waveguide 2a, a single-mode waveguide 2b, a single-mode waveguide 2c, an undesired-light single-mode waveguide 5b, and an absorption single-mode waveguide 6 that is connected to the tip end of the undesired-light single-mode waveguide 5b. A reflecting surface 4 is arranged at a position opposing the single-mode waveguide 2b in the multi-mode waveguide 1.

With the above-described configuration, light reflected off the reflecting surface 4 forms an image at a connection 31 of the undesired-light single-mode waveguide 5b and is then absorbed as undesired light within the absorption single-mode waveguide 6, which is connected to the end of the undesired-light single-mode waveguide 5b on the opposite side to the connection 31.

As compared with the case where undesired light is radiated to the outside of a waveguide or the outside of the substrate 50, this configuration absorbs light and thereby reduces the possibility that stray light may be generated in modules. This configuration is useful in cases such as where it is difficult to arrange a curved waveguide that reaches the end of the substrate 50 in relation to the arrangement of elements in an integrated circuit.

Also, a connection face 101 between the undesired-light single-mode waveguide 5b and the absorption single-mode waveguide 6 can be made non-reflective by inclining the connection face 101 at a Brewster angle (e.g., 45°). In this case, it is also possible for the absorption single-mode waveguide 6 to absorb all the light guided to the undesired-light single-mode waveguide 5b. In the case where the angle of the connection face 101 between the undesired-light single-mode waveguide 5b and the absorption single-mode waveguide 6 is not a Brewster angle, a certain degree of reflected return light can be generated at the connection face 101. On the other hand, in the case where undesired light is guided to a multi-mode waveguide, the light propagating through the multi-mode waveguide has a divergence angle and therefore it is difficult to effectively suppress the reflection of light on the connection face 101 even if adjustment is made to the angle of the connection face 101 between the multi-mode waveguide and the absorption single-mode waveguide 6.

Figure 8:
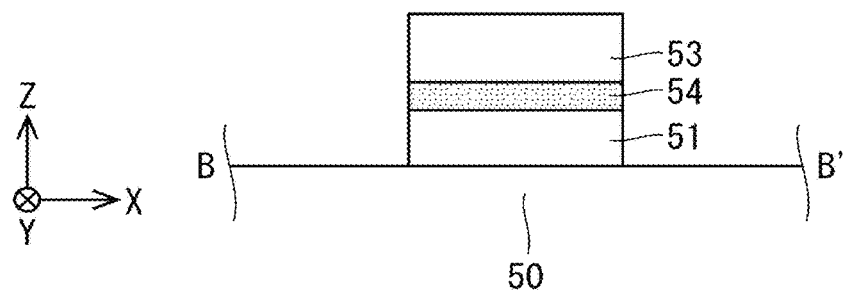
FIG. 8 is a sectional view illustrating a section B-B' of an absorption single-mode waveguide in FIG. 7.

FIG. 8 is a sectional view illustrating a section B-B' of the absorption single-mode waveguide 6 in FIG. 7. As illustrated in FIG. 8, the absorption single-mode waveguide 6 includes a substrate 50, a lower clad layer 51 formed on the upper face of the substrate 50, an absorption layer 54 formed on the upper face of the lower clad layer 51, and an upper clad layer 53 formed on the upper face of the absorption layer 54.

Undesired light that enters the absorption single-mode waveguide 6 is absorbed and disappears during propagation through the absorption single-mode waveguide 6 including the absorption layer 54.

The substrate 50 is, for example, an InP substrate. At this time, the lower clad layer 51 and the upper clad layer 53 are InP layers.

As a production procedure, first, the lower clad layer 51, which is an InP layer, is deposited on the upper face of the substrate 50, which is an InP substrate. Then, for example, a bulk layer made of an InGaAsP material can be selected and deposited as a waveguide layer on the upper face of the lower clad layer 51.

The waveguide layer can be formed in an arbitrary shape by photolithography, and in the present embodiment, a waveguide pattern as illustrated in FIG. 7 is formed in a region other than the absorption single-mode waveguide 6.

Next, for example, a multiple quantum well layer or the like made of an InGaAsP material is selected and deposited to form a pattern of the absorption single-mode waveguide 6 as illustrated in FIG. 7 by photolithography.

Thereafter, the upper clad layer 53, which is an InP layer, is deposited to form a pattern by photolithography. Regions of the single-mode waveguides 2a, 2b, and 2c and the multi-mode waveguide 1 can form a section as illustrated in FIG. 2, and a region of the absorption single-mode waveguide 6 can form a section as illustrated in FIG. 8. Through this procedure, the multi-mode interference multiplexer/demultiplexer according to the present embodiment can be produced.

Note that a structure is also conceivable in which the undesired-light single-mode waveguide 5b connected to the absorption single-mode waveguide 6 according to the present embodiment is connected to the side end 10a. In that case, for example, the reflecting surface is formed and inclined so as to go away from the end 1b of the multi-mode waveguide 1 as going away from the center line F of the multi-mode waveguide 1, as illustrated in FIG. 6.

Third Embodiment

A multi-mode interference multiplexer/demultiplexer and an MZ modulator using the same and serving as an optical element according to the present embodiment will be described. In the following description, similar configurations to those described in the above embodiments are given the same reference signs, and detailed description thereof will be appropriately omitted.

Configuration of MZ Modulator

Figure 9:
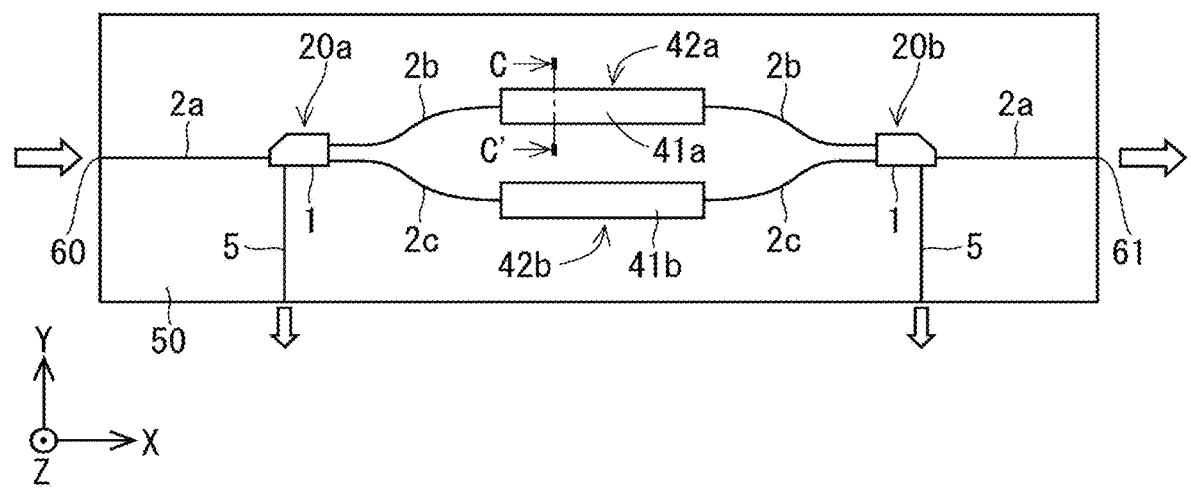
FIG. 9 is a plan view schematically illustrating a configuration of an MZ modulator according to an embodiment.

FIG. 9 is a plan view schematically illustrating a configuration of the MZ modulator according to the present embodiment. FIG. 9 illustrates the MZ modulator that includes the multi-mode interference multiplexer/demultiplexer illustrated in FIG. 1 and in which electrodes are formed in two arms of an MZ interferometer.

As illustrated in FIG. 9, the MZ modulator includes a multi-mode interference multiplexer/demultiplexer 20a, a multi-mode interference multiplexer/demultiplexer 20b, and arms 42a and 42b that are connected in parallel between the multi-mode interference multiplexer/demultiplexers 20a and 20b, each of the multi-mode interference multiplexer/demultiplexers 20a and 20b and the arms 42a and 42b being arranged on the upper face of a substrate 50.

The arm 42a is a portion that connects the multi-mode interference multiplexer/demultiplexers 20a and 20b via single-mode waveguides 2b extending respectively from the multi-mode interference multiplexer/demultiplexers 20a and 20b, and includes a modulator 41a that is formed partly in the route of the single-mode waveguides 2b.

The arm 42b is a portion that connects the multi-mode interference multiplexer/demultiplexers 20a and 20b via single-mode waveguides 2c extending respectively from the multi-mode interference multiplexer/demultiplexers 20a and 20b, and includes a modulator 41b that is formed partly in the route of the single-mode waveguides 2c.

In each of the multi-mode interference multiplexer/demultiplexers 20a and 20b, the waveguide layer in the single-mode waveguides 2b and 2c is configured of a multiple quantum well layer (MQW layer). Because the phases of light in the arms 42a and 52b change with the application of voltage to the modulators 41a and 41b, it is possible to modulate intensity or phase.

Light enters from an incidence end 60 of the MZ modulator and is branched into two streams of light by the multi-mode interference multiplexer/demultiplexer 20a. Then, the beams of light are modulated by the modulators 41a and 41b and combined by the multi-mode interference multiplexer/demultiplexer 20b. The light is then emitted from an exit end 61 of the MZ modulator.

In each of the multi-mode interference multiplexer/demultiplexer 20a on the incidence side and the multi-mode interference multiplexer/demultiplexer 20b on the exit side, light that should have been coupled to the single-mode waveguide 3 (see FIG. 1), which should originally have been arranged in a 2×2 multi-mode interference multiplexer/demultiplexer, is reflected off the reflecting surface 4 (see FIG. 1) and guided to the undesired-light single-mode waveguide 5. This light is then emitted as undesired light to the outside of a substrate 50.

In order to prevent the light reflected off the reflecting surface 4 (see FIG. 1) from turning into stray light within the MZ modulator, a coating that absorbs light may be applied to the end of the substrate 50 to absorb light. Alternatively, as with the case illustrated in the second embodiment, the absorption single-mode waveguide 6 (see FIG. 7) may be connected to the tip end of the undesired-light single-mode waveguide 5b (see FIG. 7) to absorb undesired light.

Figure 10:
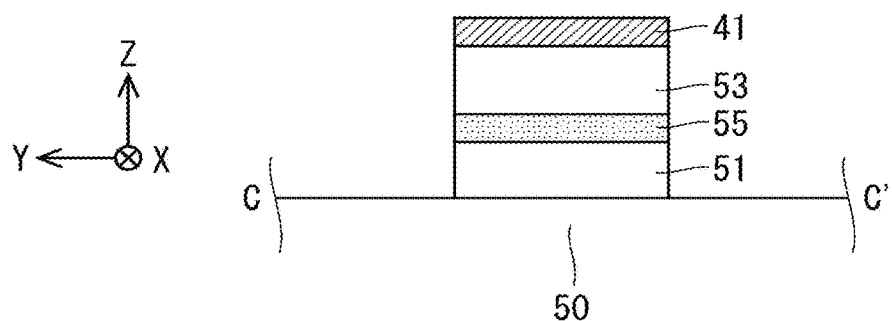
FIG. 10 is a sectional view illustrating a section C-C' of an arm at a position where a modulation electrode is formed in FIG. 9.

FIG. 10 is a sectional view illustrating a section C-C' of one arm at a position in FIG. 9 where the modulation electrode is formed. As illustrated in FIG. 10, the arm 42a includes the substrate 50, a lower clad layer 51 formed on the upper face of the substrate 50, a multiple quantum well layer 55 formed on the upper face of the lower clad layer 51, an upper clad layer 53 formed on the upper face of the multiple quantum well layer 55, and a modulation electrode 41 formed on the upper face of the upper clad layer 53.

The substrate 50 is, for example, an InP substrate. At this time, the lower clad layer 51 and the upper clad layer 53 are InP layers. The multiple quantum well layer 55 is made of an InGaAsP material. The modulation electrode 41 is an electrode for applying a modulation voltage.

As a production procedure, first, the lower clad layer 51, which is an InP layer, is deposited on the upper face of the substrate 50, which is an InP substrate. Then, for example, a bulk layer made of an InGaAsP material can be selected and deposited as a waveguide layer on the upper face of the lower clad layer 51.

The waveguide layer can be formed in an arbitrary shape by photolithography, and in the present embodiment, a waveguide pattern as illustrated in FIG. 9 is formed in a region other than the modulators 41a and 41b, i.e., in a region of the multi-mode interference multiplexer/demultiplexers 20a and 20b.

Next, for example, a multiple quantum well layer or the like made of an InGaAsP material is selected and deposited to form the multiple quantum well layer 55 by photolithography in the regions of the modulators 41a and 41b as illustrated in FIG. 9.

Thereafter, the upper clad layer 53, which is an InP layer, is deposited to form single-mode waveguides and a multi-mode waveguide by photolithography. Then, electrodes having a section as illustrated in FIG. 10 can be formed in the regions of the modulators 41a and 41b. Through this procedure, the MZ modulator according to the present embodiment can be produced.

While space outside the side faces of the waveguide in FIG. 10 is filled with air, spaces outside the side faces of the waveguides may be filled with $SiO_2$ or an organic material in order to improve long-term reliability.

The MZ modulator according to the present embodiment can suppress reflected return light.

Fourth Embodiment

A multi-mode interference multiplexer/demultiplexer and a dual-wavelength integrated modulator using the multi-mode interference multiplexer/demultiplexer and serving as an optical element according to the present embodiment will be described. In the following description, configurations similar to those described in the above embodiments are given and illustrated with the same reference signs, and detailed description thereof will be appropriately omitted.

Configuration of Dual-Wavelength Integrated Modulator

Figure 11:
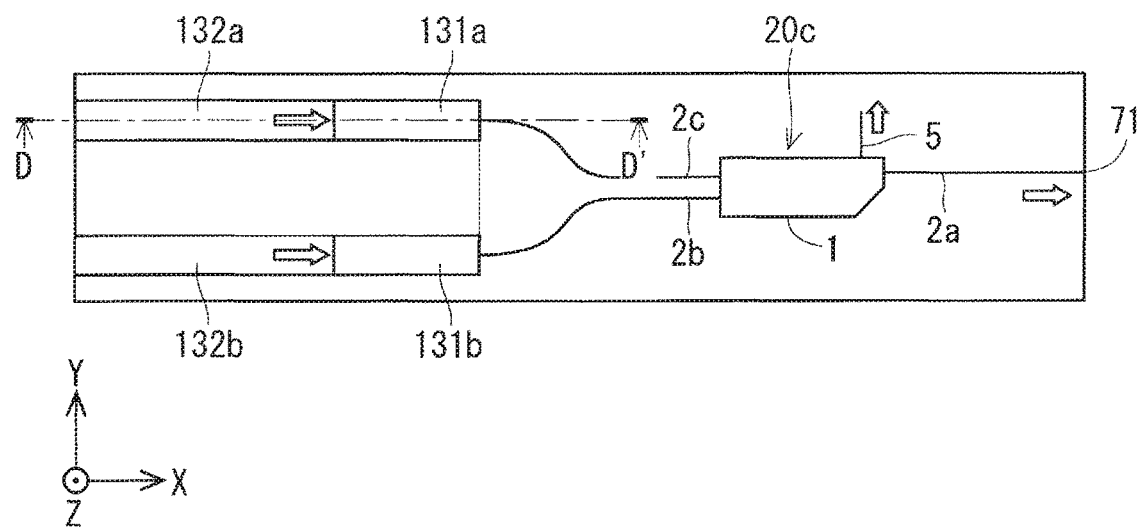
FIG. 11 is a plan view schematically illustrating a configuration of a dual-wavelength integrated modulator according to an embodiment.

FIG. 11 is a plan view schematically illustrating a configuration of the dual-wavelength integrated modulator according to the present embodiment. To address increased capacity of optical communication systems, the dual-wavelength integrated modulator can be used as a light source provided with modulators that can transmit wavelength division multiplexing signals.

As illustrated in FIG. 11, the dual-wavelength integrated modulator includes two LDs 132a and 132b having different oscillation wavelengths, two electro-absorption (EA) modulators 131a and 131b connected respectively to the LDs 132a and 132b, and a multi-mode interference multiplexer/demultiplexer 20c that is connected in parallel to the EA modulators 131a and 131b.

Light emitted from the EA modulator 131a and light emitted from the EA modulator 131b are combined by the multi-mode interference multiplexer/demultiplexer 20c. Thus, signal light of the wavelength of the LD 132a and signal light of the wavelength of the LD 132b can both be output from the same output port.

Compared with a configuration that uses two elements having different oscillation wavelengths and adopts a method of combining light emitted from these elements with an optical system such as a prism, the dual-wavelength integrated modulator illustrated in FIG. 11 can downsize modules or simplify assembly processes.

In the case where one of the LDs 132a and 132b is lit or both of the LDs 132a and 132b are lit, continuous light emitted from the LD(s) is modulated by the corresponding EA modulator(s). The light is further branched into two streams of light by the multi-mode interference multiplexer/demultiplexer 20c.

At this time, light that is reflected off the reflecting surface 4 (see FIG. 1) and coupled to the undesired-light single-mode waveguide 5 without being emitted from an exit end 71 of the dual-wavelength integrated modulator is removed as undesired light.

If reflected return light toward the LDs is generated, excellent signal light cannot be obtained. However, the dual-wavelength integrated modulator according to the present embodiment can obtain excellent signal light by suppressing reflected return light.

Figure 12:
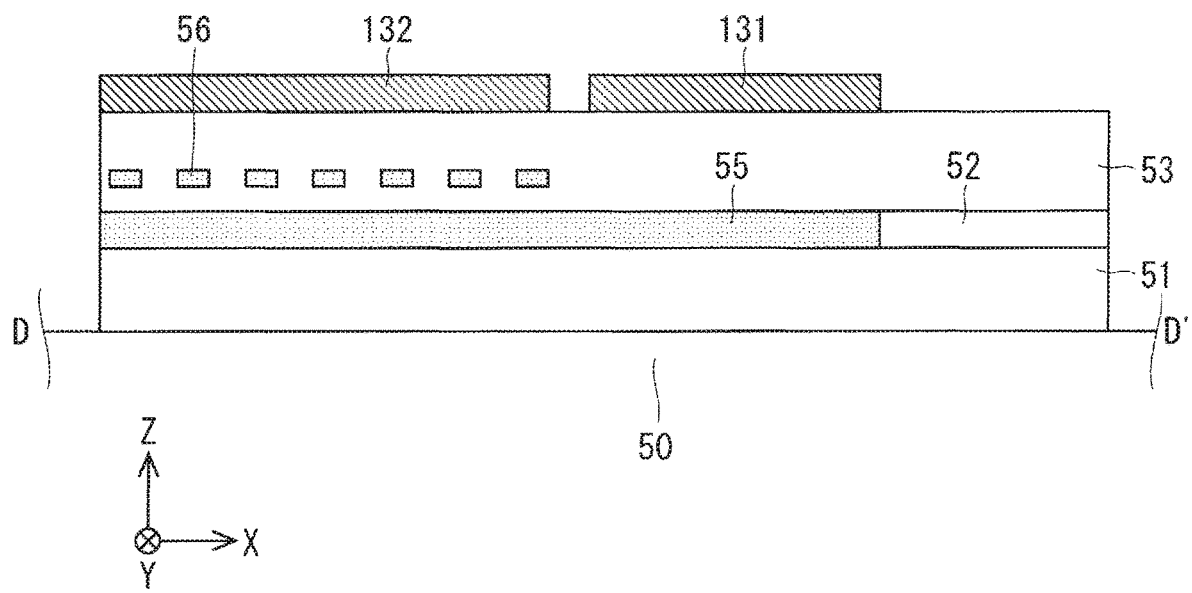
FIG. 12 is a sectional view illustrating a section D-D' in FIG. 11.

FIG. 12 is a sectional view illustrating a section D-D' in FIG. 11. As illustrated in FIG. 12, the structure spanning the LD 132a and the EA modulator 131a includes a substrate 50, a lower clad layer 51 formed on the upper face of the substrate 50, a multiple quantum well layer 55 formed at a position corresponding to the LD 132a and the EA modulator 131a on the upper face of the lower clad layer 51, a waveguide layer 52 formed at a position corresponding to the single-mode waveguide 2c on the upper face of the lower clad layer 51, an upper clad layer 53 formed on the upper face of the multiple quantum well layer 55 and on the upper face of the waveguide layer 52, a diffraction grading 56 formed intermittently inside the upper clad layer 53 and for causing the LD 132a to oscillate at a given wavelength, an LD electrode 132 formed at a position corresponding to the LD 132a on the upper face of the upper clad layer 53 and for passing a current through the LD 132a, and a modulation electrode 131 formed at a position corresponding to the EA modulator 131a on the upper face of the upper clad layer 53 and for applying a modulation voltage.

The LD electrode 132 passes a constant current through the LD 132a. Thereby, continuous light is emitted from the LD 132a. On-off control of light output is made possible by controlling the voltage applied to the modulation electrode 131, so that it is possible to generate an intensity modulation signal.

The substrate 50 is, for example, an InP substrate. At this time, the lower clad layer 51 and the upper clad layer 53 are InP layers. The multiple quantum well layer 55 and the waveguide layer 52 are made of an InGaAsP material.

As a production procedure, first, the lower clad layer 51, which is an InP layer, is deposited on the upper face of the substrate 50, which is an InP substrate. Then, for example, a bulk layer made of an InGaAsP material can be selected and deposited as a waveguide layer on the upper face of the lower clad layer 51.

The waveguide layer can be formed in an arbitrary shape by photolithography, and in the present embodiment, a waveguide pattern as illustrated in FIG. 11 is formed in a region other than the LDs 132a and 132b and the EA modulators 131a and 131b, i.e., in a region of the multi-mode interference multiplexer/demultiplexer 20c.

Next, for example, a multiple quantum well layer or the like made of an InGaAsP material is selected and deposited to form the multiple quantum well layer 55 by photolithography in the regions of the LDs 132a and 132b and the EA modulators 131a and 131b as illustrated in FIG. 11.

Thereafter, the upper clad layer 53, which is an InP layer, is deposited. In the regions of the LDs 132a and 132b, an InGaAsP diffraction grading is first formed by photolithography, and then the upper clad layer 53, which is an InP layer, is embedded therein. Then, an LD electrode 132 and a modulation electrode 131 are formed on the upper face of the upper clad layer 53. Through this procedure, the dual-wavelength integrated modulator according to the present embodiment can be produced.

The dual-wavelength integrated modulator according to the present embodiment can suppress reflected return light.

Fifth Embodiment

Figure 15:
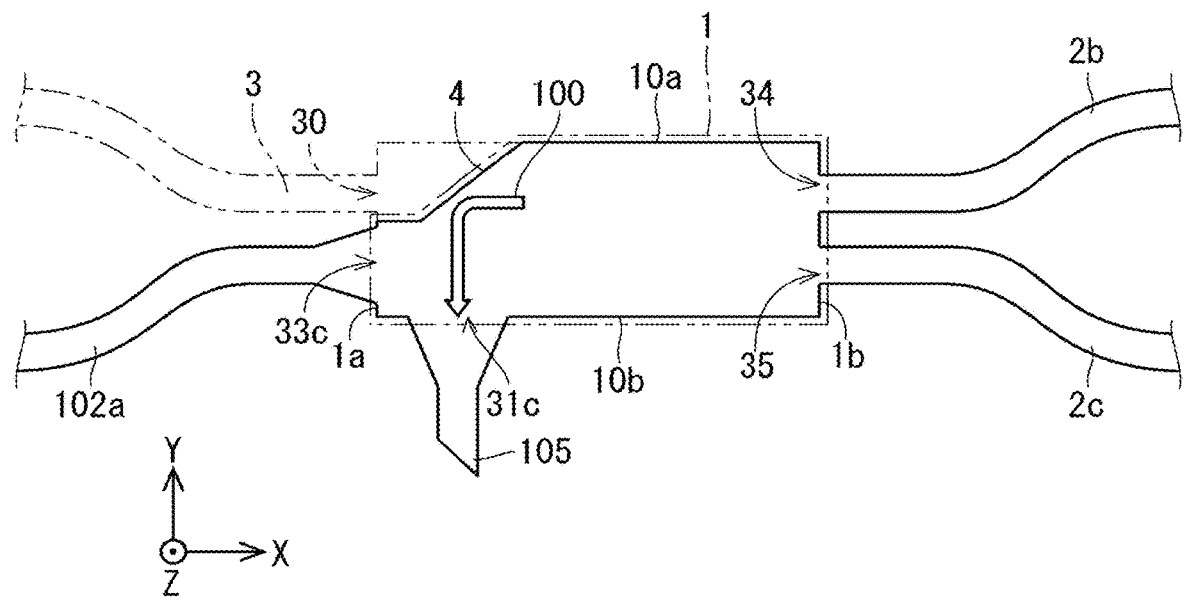
FIG. 15 is a plan view schematically illustrating a configuration of a multi-mode interference multiplexer/demultiplexer according to an embodiment.

FIG. 15 is a plan view schematically illustrating a configuration of a multi-mode interference multiplexer/demultiplexer according to the present embodiment. The multi-mode interference multiplexer/demultiplexer according to the present embodiment includes a multi-mode waveguide 1, a single-mode waveguide 102a, a single-mode waveguide 2b, a single-mode waveguide 2c, and an undesired-light single-mode waveguide 105. A reflecting surface 4 is arranged at a position opposing the single-mode waveguide 2b in the multi-mode waveguide 1.

With the above-described configuration, light reflected off the reflecting surface 4 forms an image at a connection 31c of the undesired-light single-mode waveguide 105 and is further removed as undesired light within the undesired-light single-mode waveguide 105.

The single-mode waveguide 102a is connected at a connection 33c to the multi-mode waveguide 1. The single-mode waveguide 102a has a tapered shape that expands as approaching the end connected to the multi-mode waveguide 1.

The undesired-light single-mode waveguide 105 is connected at the connection 31c to the multi-mode waveguide 1. The undesired-light single-mode waveguide 105 has a tapered shape that expands as approaching the end connected to the multi-mode waveguide 1.

If an ordinary multi-mode interference multiplexer/demultiplexer in which the single-mode waveguide 3 and the single-mode waveguide 2a are connected to the multi-mode waveguide 1 has such a structure that, like the single-mode waveguide 102a and the undesired-light single-mode waveguide 105 described above, the single-mode waveguides 3 and 2a have a tapered shape, clearance between the single-mode waveguides 3 and 2a narrows, and the single-mode waveguides 3 and 2a cannot be processed favorably.

If the single-mode waveguides cannot be processed favorably, the light entering from the single-mode waveguide 2a is unable to propagate as simulated, and problems arise, such as the light is not coupled to the single-mode waveguide 2b and the single-mode waveguide 2c. Besides, variations are caused in the processing of each produced element, and accordingly yields are reduced.

In contrast, in the multi-mode interference multiplexer/demultiplexer according to the present embodiment, two single-mode waveguides, namely the single-mode waveguide 102a and the undesired-light single-mode waveguide 105, are connected to the different ends of the multi-mode waveguide 1. Also, the single-mode waveguide 102a and the undesired-light single-mode waveguide 105 are spaced from each other. Thus, even if the connections of these single-mode waveguides to the multi-mode waveguide 1 have tapered shapes, processability of these single-mode waveguides will not deteriorate.

Meanwhile, if the connection 33c of the single-mode waveguide 102a to the multi-mode waveguide 1 has a tapered shape, and similarly, if the connection 31c of the undesired-light single-mode waveguide 105 to the multi-mode waveguide 1 has a tapered shape, it is possible to reduce transmission loss of light at the connections and to reduce reflected return light from the connections. That is, it is possible with the configuration according to the present embodiment to reduce the transmission loss of light and suppress reflected return light without deteriorating processability.

Note that at least one of the single-mode waveguide 102a and the undesired-light single-mode waveguide 105 may be a single-mode waveguide that has a tapered shape. For example, in the case where the undesired-light single-mode waveguide 105 has a tapered shape, it is possible to guide and remove more reflected return light.

Sixth Embodiment

Figure 16:
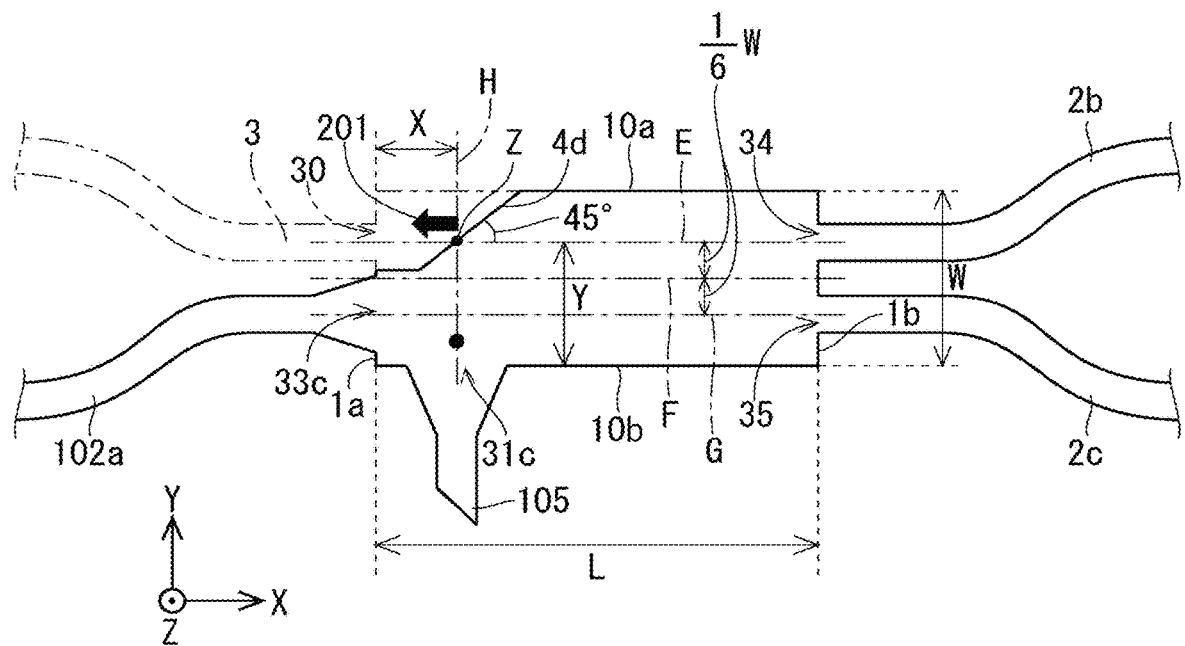
FIG. 16 is a plan view schematically illustrating a configuration of a multi-mode interference multiplexer/demultiplexer according to an embodiment.

FIG. 16 is a plan view schematically illustrating a configuration of a multi-mode interference multiplexer/demultiplexer according to the present embodiment. The multi-mode interference multiplexer/demultiplexer according to the present embodiment includes a multi-mode waveguide, a single-mode waveguide 102a, a single-mode waveguide 2b, a single-mode waveguide 2c, and an undesired-light single-mode waveguide 105. A reflecting surface 4d is arranged at a position opposing the single-mode waveguide 2b in the multi-mode waveguide.

Figure 17:
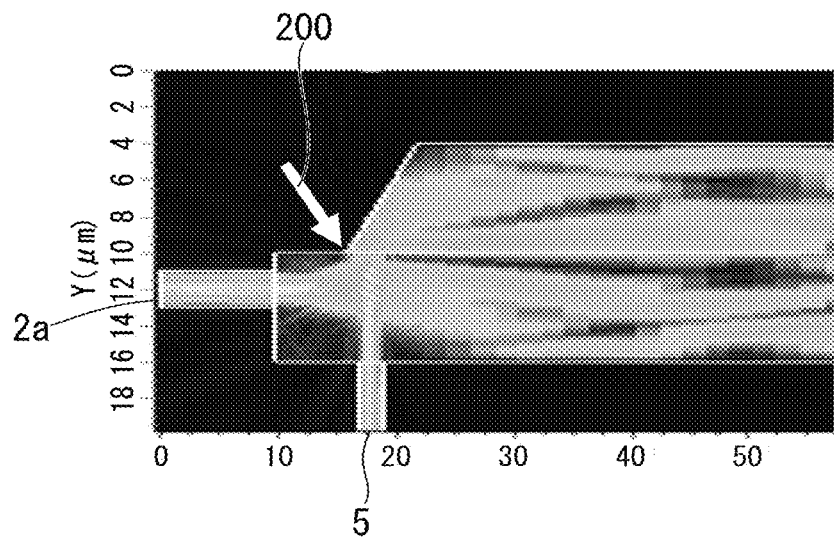
FIG. 17 is an enlarged view of part of the simulation result illustrated in FIG. 5.

FIG. 17 is an enlarged view of part of the simulation result illustrated in FIG. 5. In the case where light enters from the single-mode waveguide 2b, the light is guided to the single-mode waveguide 2a and the undesired-light single-mode waveguide 5 as illustrated in FIGS. 5 to 17.

The light guided to the single-mode waveguide 2a passes through the close proximity of a corner at a position indicated by an arrow 200 in FIG. 17. Thus, there is a possibility that a small amount of light may strike that corner, thereby resulting in loss or causing reflected return light to be generated.

In the case where light enters from the single-mode waveguide 2a, the light also propagates in the same manner and passes through the close proximity of the corner at the position indicated by the arrow 200, so that a small amount of light strikes that corner. This can result in loss or cause reflected return light to be generated.

In order to prevent the light from striking that corner, the reflecting surface 4d in FIG. 16 is displaced in parallel in a direction indicated by an arrow 201, i.e., in the negative X-axial direction. It is, however, noted that this displacement causes the reflecting point (i.e., intersection point Z) to be displaced in parallel as well.

Accordingly, it is necessary to displace the undesired-light single-mode waveguide 105 in parallel as well in the negative X-axial direction by the same length as the length of movement of the reflecting surface 4d (i.e., length in the Y-axial direction).

At this time, the image-forming point of the light is also moved by the same length in the negative X-axial direction, but the image-forming point of light is also displaced by the same length in the positive Y-axial direction. Thus, the image-forming point is located inside the multi-mode waveguide. That is, the distance Y, which is the distance between the intersection point Z and the connection 31c, becomes longer than the distance X, which is the distance between the intersection point Z and the connection 30.

In the case where the connection of the undesired-light single-mode waveguide does not have a tapered shape, i.e., the undesired-light single-mode waveguide 5 is connected, the aforementioned movement of the image-forming point will increase coupling loss between the undesired-light single-mode waveguide 5 and the multi-mode waveguide.

Meanwhile, in the case where the connection of the undesired-light single-mode waveguide has a tapered shape, i.e., where the undesired-light single-mode waveguide 105 is connected, light is easily guided to the undesired-light single-mode waveguide 105 even if the image-forming position is displaced to some extent due to the aforementioned movement of the image-forming point. Accordingly, it is possible to remove the light guided to the undesired-light single-mode waveguide 105 as reflected return light without increasing the coupling loss.

In the case where the image-forming point is displaced by approximately 4 µm in the positive Y-axial direction, possible excess loss is approximately 0.6 dB even if the connection of the single-mode waveguide does not have a tapered shape. In a similar case, if the connection of the single-mode waveguide has a tapered shape, excess loss can be further reduced.

The multi-mode interference multiplexer/demultiplexer according to the present embodiment can reduce loss of light entering or emitted from the single-mode waveguide 102a and suppress reflected return light without impairing the function of the undesired-light single-mode waveguide 105 that removes reflected return light.

Seventh Embodiment

Figure 18:
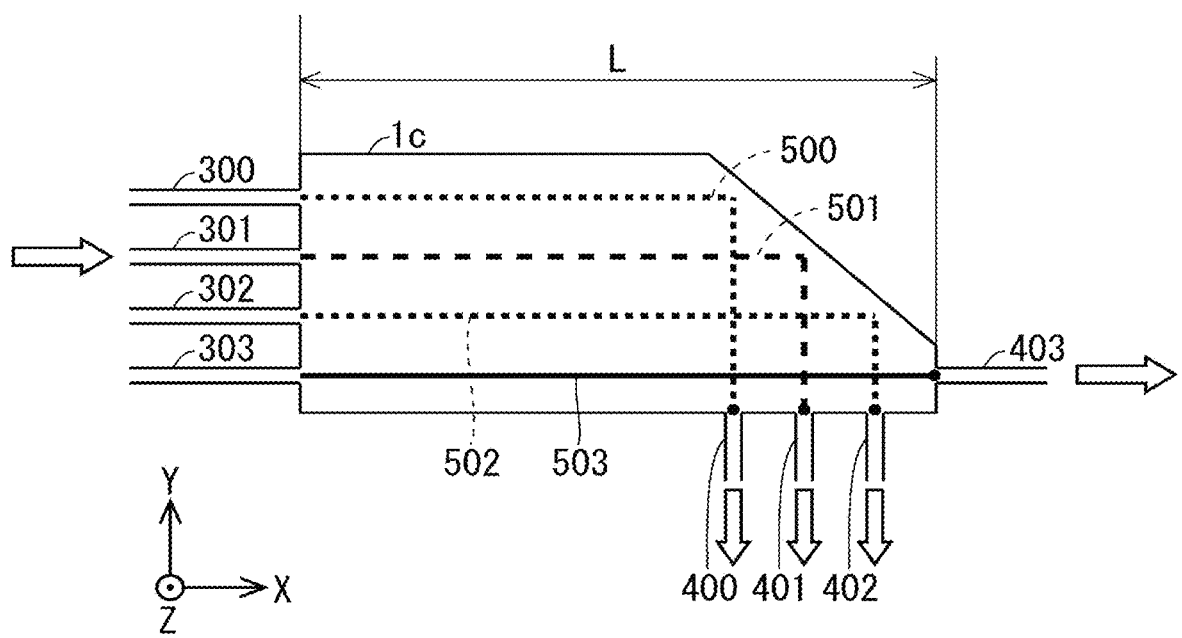
FIG. 18 is a plan view schematically illustrating a configuration of a multi-mode interference multiplexer/demultiplexer according to an embodiment.

FIG. 18 is a plan view schematically illustrating a configuration of a multi-mode interference multiplexer/demultiplexer according to the present embodiment. In each of the above-described embodiments, the basic design is that of a 2×2 multi-mode interference multiplexer/demultiplexer, but the number of single-mode waveguides on the input and output sides may be increased and an N×N multi-mode interference multiplexer/demultiplexer may be used as the basic design. For example, a 4×4 multi-mode interference multiplexer/demultiplexer may be used as illustrated in the present embodiment.

As illustrated in FIG. 18, a multi-mode waveguide 1c is connected to input ports 300, 301, 302, and 303. The multi-mode waveguide 1c is also connected to output ports 400, 401, 402, and 403.

Meanwhile, FIG. 19 is a plan view schematically illustrating a configuration of an ordinary 4×4 multi-mode interference multiplexer/demultiplexer. A multi-mode waveguide 1d in FIG. 19 has a square configuration that includes no reflecting surface.

As illustrated in FIG. 19, the multi-mode waveguide 1d is connected to input ports 300, 301, 302, and 303. The multi-mode waveguide 1d is also connected to output ports 400, 401, 402, and 403.

As in the case of the 2×2 multi-mode interference multiplexer/demultiplexer, in the basic design of the 4×4 multi-mode interference multiplexer/demultiplexer, the length of the multi-mode waveguide and positions at which the single-mode waveguides are connected are uniquely determined if the width of the multi-mode waveguide is determined. For example, in the case where the width of the multi-mode waveguide is set to 24 µm, the multi-mode waveguide has a length of 1200 µm, and the single-mode waveguides are arranged at intervals of 6 µm.

In FIG. 19, when light enters from one of the four input ports, the light is branched into four streams of light and output from the four output ports.

On the other hand, in the multi-mode interference multiplexer/demultiplexer according to the present embodiment illustrated in FIG. 18, light entering from the input port 300, light entering from the input port 301, and light entering from the input port 302 are perpendicularly reflected off the reflecting surface and coupled respectively to the output ports 400, 401, and 402. These streams of light are removed as undesired light.

The light entering from the input port 303 is not reflected off the reflecting surface and emitted from the output port 403. This light is used as, for example, signal light.

By arranging the reflecting surface on the output side in this way, undesired light is caused to propagate in a direction perpendicular to the direction of propagation of the signal light. The propagation of undesired light in that perpendicular direction suppresses mixing of the undesired light with the signal light and maintains signal quality.

A comparison between the case illustrated in FIG. 19 and the case illustrated in FIG. 18 shows that, in the case illustrated in FIG. 18, for example, there is no other output ports located in close proximity to the output port 403 that outputs signal light. This improves processability of the output port 403 and improves yields.

If A is a path length 500 illustrated in FIG. 18, B is a path length 501, C is a path length 502, and D is a path length 503, the position of connection between the reflecting surface and the position at which the undesired-light single-mode waveguide is connected are set so that a multi-mode waveguide length L of the multi-mode waveguide 1c satisfies the following equation.

$$L = \text{length } A = \text{length } B = \text{length } C = \text{length } D \qquad \text{Equation 2}$$

Here, for example, the length A (path length 500) is a sum of a length in the horizontal direction from the connection between the input port 300 and the multi-mode waveguide 1c to the reflecting surface and a length in the vertical direction from an intersection of the reflecting surface and a line that passes through the connection of the input port 300 along the X-axial direction to the connection between the output port 400 and the multi-mode waveguide 1c.

With the above-described settings, the light reflected off the reflecting surface is guided to the undesired-light single-mode waveguide.

Figure 20:
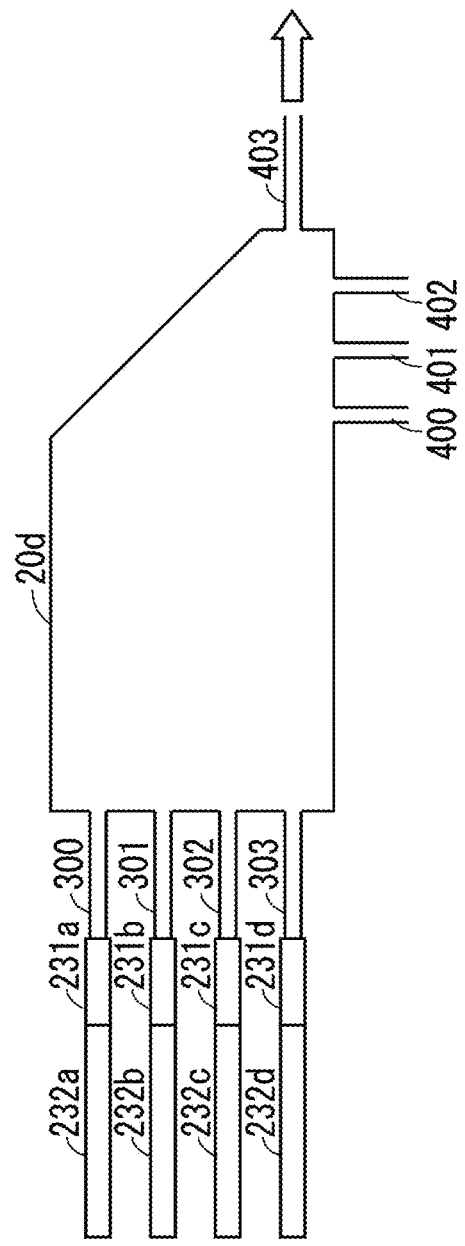
FIG. 20 illustrates a quad-wavelength integrated modulator that applies the multi-mode interference multiplexer/demultiplexer in FIG. 18.

FIG. 20 illustrates a quad-wavelength integrated modulator that employs the multi-mode interference multiplexer/demultiplexer illustrated in FIG. 18. The dual-wavelength integrated modulator illustrated in FIG. 11 employs a 2×2 multi-mode interference multiplexer/demultiplexer, but FIG. 20 illustrates a quad-wavelength integrated modulator that employs a 4×4 multi-mode interference multiplexer/demultiplexer. Compared with the dual-wavelength integrated modulator that combines two streams of signal light, the quad-wavelength integrated modulator can double data capacity by combining and outputting four streams of signal light having different wavelengths.

As illustrated in FIG. 20, the quad-wavelength integrated modulator includes four LDs 232a, 232b, 232c, and 232d having different oscillation wavelengths, four EA modulators 231a, 231b, 231c, and 231d that are connected respectively to the four LDs, and a multi-mode interference multiplexer/demultiplexer 20d that is connected in parallel to each of the EA modulators 231a, 231b, 231c, and 231d.

Like the dual-wavelength integrated modulator, the quad-wavelength integrated modulator according to the present embodiment can also obtain excellent signal light without generating reflected return light toward the LDs, because undesired light is guided to and removed within the undesired-light single-mode waveguide.

Effects Achieved by Above-Described Embodiments

Next, effects achieved by the above-described embodiments are exemplified. In the following description, the effects are described based on specific configurations exemplified in the above-described embodiments, but those specific configurations may be replaced by other specific configurations exemplified in the specification of the present application within a range that produces similar effects.

This replacement can be made across a plurality of embodiments. That is, similar effects can be produced by combining configurations exemplified in different embodiments.

According to the above-described embodiments, a multi-mode interference multiplexer/demultiplexer includes a multi-mode waveguide 1, a first single-mode waveguide, a second single-mode waveguide, a third single-mode waveguide, a reflecting surface, and a fourth single-mode waveguide connected at a first connection. Here, the first single-mode waveguide corresponds to, for example, the single-mode waveguide 2a. The second single-mode waveguide corresponds to, for example, the single-mode waveguide 2c. The third single-mode waveguide corresponds to, for example, the single-mode waveguide 2b. The reflecting surface corresponds to, for example, one of the reflecting surfaces 4, 4a, 4b, and 4c. The fourth single-mode waveguide corresponds to, for example, one of the undesired-light single-mode waveguides 5, 5a, 5b, 5c, and 5d depending on the reflecting surface. The first connection corresponds to, for example, one of the connections 31, 31a, 31b, and 32 depending on the fourth single-mode waveguide. The multi-mode waveguide 1 has a first end, a second end, a first side end, and a second side end, the second end being an end on the opposite side to the first end, and the first side end and the second side end opposing each other. If a direction connecting the first end and the second end is a first direction and a direction intersecting with the first direction is a second direction, the first side end and the second side end oppose each other in the section direction. Here, the first end corresponds to, for example, the end 1a. The second end corresponds to, for example, the end 1b. The first direction corresponds to, for example, the X-axial direction. The second direction corresponds to, for example, the Y-axial direction. The first side end corresponds to, for example, the side end 10a. The second side end corresponds to, for example, the side end 10b. The single-mode waveguide 2a is connected to the end 1a of the multi-mode waveguide 1. The single-mode waveguide 2c is connected to the end 1b of the multi-mode waveguide 1 at a position opposing the single-mode waveguide 2a. The single-mode waveguide 2b is connected to the end 1b of the multi-mode waveguide 1 at a position closer to the side end 10a than the position at which the single-mode waveguide 2c is connected. The reflecting surface 4 is arranged at a position opposing the single-mode waveguide 2b in the multi-mode waveguide 1. The undesired-light single-mode waveguide 5 is connected to the side end 10b. Then, light entering from the single-mode waveguide 2c or 2b is reflected off the reflecting surface 4 and forms an image at the connection 31, which is a connection of the undesired-light single-mode waveguide 5 at the side end 10b.

With this configuration, potential reflected return light can be guided to the undesired-light single-mode waveguide 5 by causing the light to be reflected off the reflecting surface 4 and form an image at the connection 31. Accordingly, it is possible to suppress reflected return light in the multi-mode interference multiplexer/demultiplexer while easily forming a layout that includes a curved waveguide for dealing with undesired light.

Since the undesired-light single-mode waveguide 5 is connected to the side end 10b of the multi-mode waveguide 1, the undesired-light single-mode waveguide 5 can be connected at a position that is relatively spaced from the single-mode waveguide 2a.

In the case where clearance between two single-mode waveguides is narrow, e.g., approximately 2 μm, at the time of forming a pattern by photolithography, it is highly likely that the clearance cannot be processed properly and therefore the lower clad layer 51, the waveguide layer 52, and the upper clad layer 53 that should be removed will remain as-is. If proper processing is not possible, light entering from the single-mode waveguide 2a does not propagate as simulated, and problems arises, such as the light is not coupled to the single-mode waveguides 2b and 2c.

Note that other configurations exemplified in the specification of the present application, except the above-described configuration, can be appropriately omitted. That is, the above-described effects can be achieved, at least when the above-described configuration is included.

However, the above-described effects can be achieved in the same manner even in the case where at least one of the other configurations exemplified in the specification of the present application is appropriately added to the above-described configuration, i.e., where other configurations that are not described as the above-described configuration but is exemplified in the specification of the present application are added to the above-described configuration.

According to the above-described embodiments, the undesired-light single-mode waveguide 5 is connected to the side end 10b. The reflecting surface 4 is an inclined plane that approaches the end 1b as approaching the side end 10a. With this configuration, the light reflected off the reflecting surface 4 forms an image at the connection 31 of the undesired-light single-mode waveguide 5 connected to the side end 10b.

According to the above-described embodiments, the undesired-light single-mode waveguide 5a is connected to the side end 10a. The reflecting surface 4a is an inclined plane that goes away from the end 1b as approaching the side end 10a. With this configuration, the light reflected off the reflecting surface 4a forms an image at the connection 32 of the undesired-light single-mode waveguide 5a connected to the side end 10a.

According to the above-described embodiments, if a point at which light entering from the single-mode waveguide 2c or 2b is reflected off the reflecting surface 4 is a reflecting point, a distance between the reflecting point and the end 1a in a direction along the X-axial direction is a first distance, and a distance between the reflecting point and the connection 31 in the direction along the X-axial direction is a second distance, the first distance and the second distance are equal. Here, the reflecting point corresponds to, for example, the intersection point Z. The first distance corresponds to, for example, the distance X. The second distance corresponds to, for example, the distance Y. With this configuration, light that should have formed an image at the connection 30 of the single-mode waveguide 3 is reflected off the reflecting surface 4 and then forms an image at the connection 31 of the undesired-light single-mode waveguide 5 on the side end 10b of the multi-mode waveguide 1 at a distance of propagation similar to that in the case where there is no reflecting surface 4.

According to the above-described embodiments, the axis line H of the undesired-light single-mode waveguide 5 that extends along the longitudinal direction passes through the intersection point Z. With this configuration, the light reflected off the reflecting surface 4 forms an image at the connection 31 of the undesired-light single-mode waveguide 5 and is guided to and propagates through the undesired-light single-mode waveguide 5. At this time, the reflection of the light at the connection 31 can be suppressed because the direction of light entering the undesired-light single-mode waveguide 5 is along the direction of the axis line H of the undesired-light single-mode waveguide 5.

According to the above-described embodiments, the multi-mode interference multiplexer/demultiplexer further includes a fifth single-mode waveguide that is connected to the end of the undesired-light single-mode waveguide 5b on the opposite side to the connection 31 and that includes the absorption layer 54 that absorbs incident light. Here, the fifth single-mode waveguide corresponds to, for example, the absorption single-mode waveguide 6. With this configuration, the light guided to the inside of the undesired-light single-mode waveguide 5b is absorbed within the absorption single-mode waveguide 6. Accordingly, a possibility that stray light may be generated in modules can be reduced by absorbing undesired light. This configuration is in particular useful in cases such as where it is difficult to arrange a curved waveguide that reaches the end of the substrate 50 in relation to the arrangement of elements in an integrated circuit.

According to the above-described embodiments, the angle of the connection face 101 between the undesired-light single-mode waveguide 5b and the absorption single-mode waveguide 6 is a Brewster angle. With this configuration, it is possible to suppress the reflection of light at the connection face 101 between the undesired-light single-mode waveguide 5b and the absorption single-mode waveguide 6. Ideally, it is possible to eliminate reflection at the connection face 101 and to absorb all undesired light into the absorption layer 54.

According to the above-described embodiments, an optical element includes at least one multi-mode interference multiplexer/demultiplexer described above. With this configuration, it is possible to suppress reflected return light in the optical element such as a Mach-Zehnder modulator or a dual-wavelength integrated modulator. For example, in the case where an MZ interferometer is configured by connecting two ordinary 2×2 multi-mode interference multiplexer/demultiplexers, one single-mode waveguide that is not used is arranged on each of the incidence and exit sides. Thus, such single-mode waveguides can be connected to the side ends of the multi-mode waveguides 1 and used as the undesired-light single-mode waveguides for removing undesired light.

According to the above-described embodiments, the distance Y is greater than the distance X. With this configuration, the image-forming point is located inside the multi-mode waveguide 1, but excess loss caused by the displacement of the image-forming point in the positive Y-axial direction is not so great, and it is possible to further reduce the excess loss by causing the connection of the single-mode waveguide to have a tapered shape.

According to the above-described embodiments, at least one of the single-mode waveguide 102a and the undesired-light single-mode waveguide 105 has a tapered shape. With this configuration, it is possible to reduce light transmission loss at the connection and reduce reflected return light from the connection. That is, it is possible to reduce light transmission loss and suppress reflected return light without deteriorating processability.

According to the above-described embodiments, the multi-mode interference multiplexer/demultiplexer includes the input ports 300, 301, 302, and 303, which are single-mode waveguides, and the output ports 400, 401, 402, and 403, which are undesired-light single-mode waveguides that correspond respectively to the single-mode waveguides. If the lengths A, B, C, and D are each a path length from a position where light that enters perpendicularly from each of the single-mode waveguides into the multi-mode waveguide 1c is reflected off the reflecting surface to a position of a corresponding one of the undesired-light single-mode waveguides, the reflecting surface and the undesired-light single-mode waveguide are arranged so that the length L of the multi-mode waveguide 1c satisfies the following equation:

$$L = \text{length } A = \text{length } B = \text{length } C = \text{length } D \qquad \text{Equation 3}$$

With this configuration, it is possible to obtain excellent signal light without generating reflected return light toward the LDs because undesired light is guided to and removed within the undesired-light single-mode waveguide.

Variations of Above-Described Embodiments

While the angle of the reflecting surface 4 with respect to the X-axial direction is 45° according to the above-described embodiments, the angle of the reflecting surface is not limited to this case.

Figure 13:
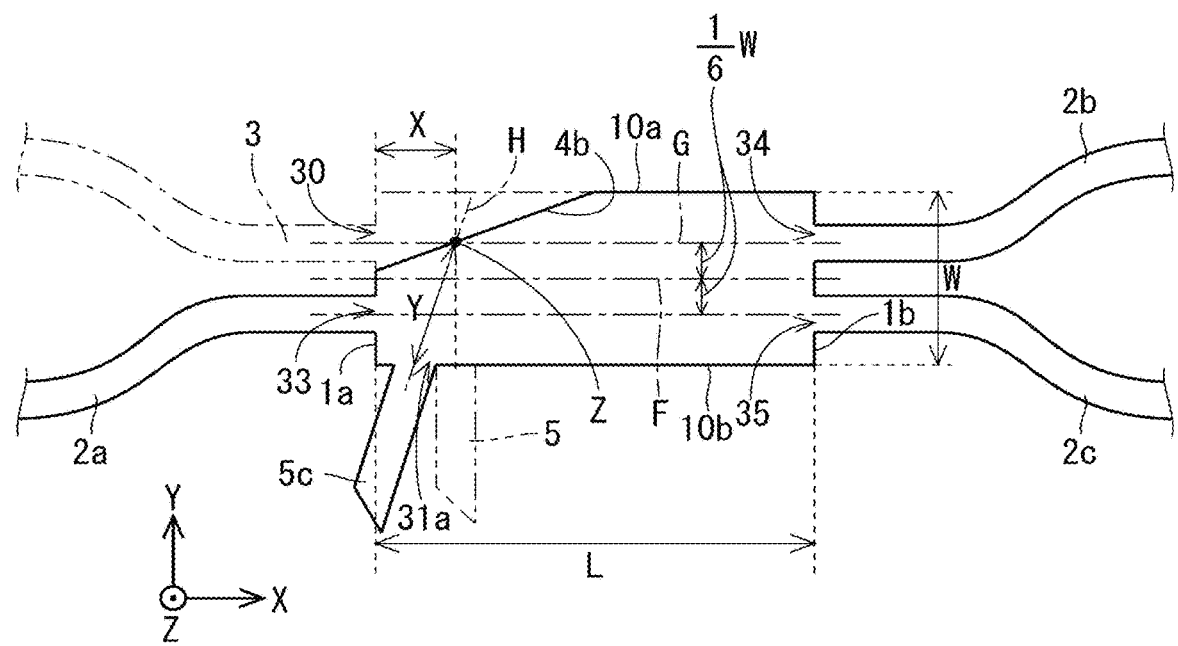
FIG. 13 is a plan view illustrating a variation of the configuration of the multi-mode interference multiplexer/demultiplexer.

FIG. 13 is a plan view illustrating a detailed configuration of a multi-mode interference multiplexer/demultiplexer when the reflecting surface has a different angle. As illustrated in FIG. 13, the relationship that the distance X and the distance Y are equal is maintained even if the angle of the reflecting surface 4b is greater than that in the case illustrated in FIG. 3. Then, the connection 31a of the undesired-light single-mode waveguide 5c is displaced in the negative X-axial direction along the direction of light reflection at the intersection point Z.

In this case, it is desirable to incline the angle of connection of the undesired-light single-mode waveguide 5c at the connection 31a as well so that the axis line H of the undesired-light single-mode waveguide 5c that extends along the longitudinal direction passes through the intersection point Z. This is in order to suppress reflection at the connection 31a when the light reflected off the reflecting surface 4b enters the undesired-light single-mode waveguide 5c.

Figure 14:
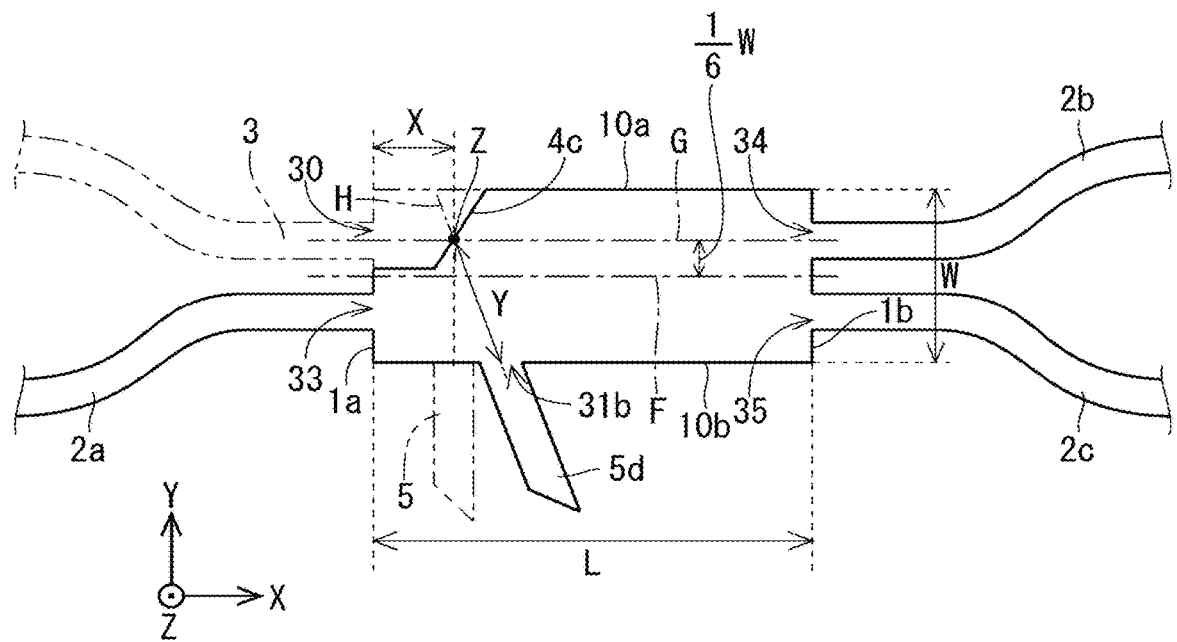
FIG. 14 is a plan view illustrating a variation of the configuration of the multi-mode interference multiplexer/demultiplexer.

FIG. 14 is a plan view illustrating a detailed configuration of a multi-mode interference multiplexer/demultiplexer when the reflecting surface has a different angle. As illustrated in FIG. 14, the relationship that the distance X and the distance Y are equal is maintained even if the angle of the reflecting surface 4c is smaller than that in the case illustrated in FIG. 3. Then, the connection 31b of the undesired-light single-mode waveguide 5d is displaced in the positive X-axial direction along the direction of light reflection at the intersection point Z.

In this case, it is desirable to incline the angle connection of the undesired-light single-mode waveguide 5d at the connection 31b as well so that the axis line H of the undesired-light single-mode waveguide 5d that extends along the longitudinal direction passes through the intersection point Z. This is in order to suppress reflection at the connection 31b when the light reflected off the reflecting surface 4c enters the undesired-light single-mode waveguide 5d.

While the above-described embodiments may in some cases describe the quality of a material, material, dimensions, shape, and relative locations and positioning of each constituent element, conditions for implementation, and the like, these features are all illustrative in all aspects and are not limited to the examples described in the specification of the present application.

Accordingly, an unlimited number of variations and equivalents that are not exemplified are assumed to fall within the scope of the technique disclosed in the specification of the present application. For example, the scope of the technique is assumed to include cases where at least one constituent element is modified, added, or omitted and cases where at least one constituent element in at least one embodiment is extracted and combined with constituent elements in other embodiments.

In the above-described embodiments, "one" constituent element may include "one or more" constituent elements as long as no contradiction arises.

Each constituent element in the above-describe embodiments is perceived as a conceptual unit, and the scope of the technique disclosed in the specification of the present application is assumed to include cases where one constituent element is configured by a plurality of structural elements, cases where one constituent element corresponds to part of a certain structural element, and cases where a plurality of constituent elements is included in one structural element.

Each constituent element described in the above-described embodiments is assumed to include structural elements having other structures or shapes as long as it can achieve the same function.

The description in the specification of the present application shall be referred to for all purposes relating to the technique of the present application, and nothing in the specification shall be regarded as conventional technology.

When features such as material names are described with no particular indication in the above-described embodiments, those materials are assumed to include other additives such as an alloy, as long as no contradiction arises.

EXPLANATION OF REFERENCE SIGNS 1, 1c, 1d: multi-mode waveguide, 1a, 1b: end, 2a, 2b, 2c, 3, 102a: single-mode waveguide, 4, 4a, 4b, 4c, 4d: reflecting surface, 5, 5a, 5b, 5c, 5d, 105: undesired-light single-mode waveguide, 6: absorption single-mode waveguide, 10a, 10b: side end, 20a, 20b, 20c, 20d: multi-mode interference multiplexer/demultiplexer, 30, 31, 31a, 31b, 31c, 32, 33, 33c, 34, 35: connection, 41, 131: modulation electrode, 41a, 41b: modulator, 42a, 42b: arm, 50: substrate, 51: lower clad layer, 52: waveguide layer, 53: upper clad layer, 54: absorption layer, 55: multiple quantum well layer, 56: diffraction grading, 60: incidence end, 61, 71: exit end, 100: undesired light, 101: connection face, 131a, 131b, 231a, 231b, 231c, 231d: EA modulator, 132: LD electrode, 132a, 132b: LD, 200, 201: arrow, 300, 301, 302, 303: input port, 400, 401, 402, 403: output port, 500, 501, 502, 503: path length, E, G, H: axis line, F: center line, L: multi-mode waveguide length, W: multi-mode waveguide width, X, Y: distance, Z: intersection.

The invention claimed is:

1. A multi-mode interference multiplexer/demultiplexer comprising:
a multi-mode waveguide having a first end, a second end, a first side end, and a second side end, the second end being an end on an opposite side to the first end, and the first side end and the second side end opposing each other;
a first single-mode waveguide connected to the first end of the multi-mode waveguide;
a second single-mode waveguide connected to the second end of the multi-mode waveguide at a position opposing the first single-mode waveguide;
a third single-mode waveguide connected to the second end of the multi-mode waveguide at a position closer to the first side end than the position at which the second single-mode waveguide is connected;
a reflecting surface arranged at a position opposing the third single-mode waveguide in the multi-mode waveguide; and
a fourth single-mode waveguide for undesired light connected to the first side end or the second side end, wherein a direction connecting the first end and the second end is a first direction,
a direction intersecting with the first direction is a second direction,
the first side end and the second side end oppose each other in the second direction,
undesired light entering from the second single-mode waveguide or the third single-mode waveguide is reflected off the reflecting surface and thereafter forms an image at a first connection of the fourth single-mode waveguide, and
the first connection is a connection at the first side end or a connection at the second side end.

2. The multi-mode interference multiplexer/demultiplexer according to claim 1, wherein
the fourth single-mode waveguide is connected to the second side end, and
the reflecting surface is an inclined plane that approaches the second end as approaching the first side end.

3. The multi-mode interference multiplexer/demultiplexer according to claim 1, wherein
the fourth single-mode waveguide is connected to the first side end, and
the reflecting surface is an inclined plane that goes away from the second end as approaching the first side end.

4. The multi-mode interference multiplexer/demultiplexer according to claim 1, wherein
if a point at which light entering from the second single-mode waveguide or the third single-mode waveguide is reflected off the reflecting surface is a reflecting point,
if a distance between the reflecting point and the first end in a direction along the first direction is a first distance, and
if a distance between the reflecting point and the first connection is a second distance,
the first distance and the second distance are equal.

5. The multi-mode interference multiplexer/demultiplexer according to claim 4, wherein
an axis line of the fourth single-mode waveguide that extends along a longitudinal direction passes through the reflecting point.

6. The multi-mode interference multiplexer/demultiplexer according to claim 1, wherein
if a point at which light entering from the second single-mode waveguide or the third single-mode waveguide is reflected off the reflecting surface is a reflecting point,
if a distance between the reflecting point and the first end in a direction along the first direction is a first distance, and
if a distance between the reflecting point and the first connection is a second distance,
the second distance is greater than the first distance.

7. The multi-mode interference multiplexer/demultiplexer according to claim 1, wherein
at least one of the first single-mode waveguide and the fourth single-mode waveguide has a tapered shape.

8. The multi-mode interference multiplexer/demultiplexer according to claim 1, further comprising:
a fifth single-mode waveguide that is connected to an end of the fourth single-mode waveguide on the opposite side to the first connection and that includes an absorption layer that absorbs incident light.

9. The multi-mode interference multiplexer/demultiplexer according to claim 8, wherein
an angle of a connection face between the fourth single-mode waveguide and the fifth single-node waveguide is a Brewster angle.

10. The multi-mode interference multiplexer/demultiplexer according to claim 1, comprising:
a plurality of third single-mode waveguides, each of which is the third single-mode waveguide; and
a plurality of fourth single-mode waveguides, each of which is the fourth single-mode waveguide, each of the plurality of fourth single-mode waveguides corresponding to each of the plurality of third single-mode waveguides,
wherein, if lengths A, B, C, and D are each a path length from a position where light that enters perpendicularly from each of the plurality of third single-mode waveguides into the multi-mode waveguide is reflected off the reflecting surface to a position of a corresponding one of the plurality of fourth single-mode waveguides,
the reflecting surface and the fourth single-mode waveguide are arranged at a position where a length L of the multi-mode waveguide satisfies:

$$L = \text{length } A = \text{length } B = \text{length } C = \text{length } D.$$

11. The multi-mode interference multiplexer/demultiplexer according to claim 1, wherein
the first connection is between the first end and the second end.

12. An optical element comprising:
at least one multi-mode interference multiplexer/demultiplexer including
a multi-mode waveguide having a first end, a second end, a first side end, and a second side end, the second end being an end on an opposite side to the first end, and the first side end and the second side end opposing each other;
a first single-mode waveguide connected to the first end of the multi-mode waveguide;
a second single-mode waveguide connected to the second end of the multi-mode waveguide al a position opposing the first single-mode waveguide;
a third single-mode waveguide connected to the second end of the multi-mode waveguide at a position closer to the first side end than the position at which the second single-mode waveguide is connected;
a reflecting surface arranged at a position opposing the third single-mode waveguide in the multi-mode waveguide; and
a fourth single-mode waveguide for undesired light connected to the first side end or the second side end,
wherein a direction connecting the first end and the second end is a first direction,
a direction intersecting with the first direction is a second direction,
the first side end and the second side end oppose each other in the second direction,
undesired light entering from the second single-mode waveguide or the third single-mode waveguide is reflected off the reflecting surface and thereafter forms an image at a first connection of the fourth single-mode waveguide, and
the first connection is a connection at the first side end or a connection at the second side end.

* * * * *